United States Patent
Haba

(10) Patent No.: US 8,659,164 B2
(45) Date of Patent: *Feb. 25, 2014

(54) MICROELECTRONIC PACKAGE WITH TERMINALS ON DIELECTRIC MASS

(71) Applicant: Tessera, Inc., San Jose, CA (US)

(72) Inventor: Belgacem Haba, Saratoga, CA (US)

(73) Assignee: Tessera, Inc., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/648,495

(22) Filed: Oct. 10, 2012

(65) Prior Publication Data

US 2013/0032387 A1 Feb. 7, 2013

Related U.S. Application Data

(63) Continuation of application No. 13/295,608, filed on Nov. 14, 2011.

(30) Foreign Application Priority Data

Nov. 15, 2010 (KR) .................. 10-2010-0113271

(51) Int. Cl.
*H01K 1/18* (2006.01)

(52) U.S. Cl.
USPC ....... 257/774; 257/734; 257/E23.01; 174/260

(58) Field of Classification Search
USPC .................. 174/260; 257/774, 734, E23.011, 257/E23.01
See application file for complete search history.

(56) References Cited

U.S. PATENT DOCUMENTS

| | | |
|---|---|---|
| 3,358,897 A | 12/1967 | Christensen |
| 3,623,649 A | 11/1971 | Keisling |
| 3,795,037 A | 3/1974 | Luttmer |
| 3,900,153 A | 8/1975 | Beerwerth et al. |
| 4,327,860 A | 5/1982 | Kirshenboin et al. |
| 4,422,568 A | 12/1983 | Elles et al. |
| 4,437,604 A | 3/1984 | Razon et al. |
| 4,604,644 A | 8/1986 | Beckham et al. |
| 4,695,870 A | 9/1987 | Patraw |

(Continued)

FOREIGN PATENT DOCUMENTS

| | | |
|---|---|---|
| EP | 920058 | 6/1999 |
| EP | 2234158 A1 | 9/2010 |

(Continued)

OTHER PUBLICATIONS

"EE Times Asia" [online]. [Retrieved Aug. 5, 2010]. Retrieved from internet. <http://www.eetasia.com/ART_8800428222_480300_nt_dec52276.HTM>, 4 pages.

(Continued)

*Primary Examiner* — Roy Potter
(74) *Attorney, Agent, or Firm* — Lerner, David, Littenberg, Krumholz & Mentlik, LLP

(57) ABSTRACT

A package for a microelectronic element, such as a semiconductor chip, has a dielectric mass overlying the package substrate and microelectronic element and has top terminals exposed at the top surface of the dielectric mass. Traces extending along edge surfaces of the dielectric mass desirably connect the top terminals to bottom terminals on the package substrate. The dielectric mass can be formed, for example, by molding or by application of a conformal layer.

30 Claims, 8 Drawing Sheets

(56) References Cited

U.S. PATENT DOCUMENTS

| | | |
|---|---|---|
| 4,716,049 A | 12/1987 | Patraw |
| 4,771,930 A | 9/1988 | Gillotti et al. |
| 4,793,814 A | 12/1988 | Zifcak et al. |
| 4,804,132 A | 2/1989 | DiFrancesco |
| 4,902,600 A | 2/1990 | Tamagawa et al. |
| 4,924,353 A | 5/1990 | Patraw |
| 4,975,079 A | 12/1990 | Beaman et al. |
| 4,982,265 A | 1/1991 | Watanabe et al. |
| 4,998,885 A | 3/1991 | Beaman |
| 4,999,472 A | 3/1991 | Neinast et al. |
| 5,067,382 A | 11/1991 | Zimmerman et al. |
| 5,083,697 A | 1/1992 | Difrancesco |
| 5,095,187 A | 3/1992 | Gliga |
| 5,138,438 A | 8/1992 | Masayuki et al. |
| 5,148,265 A | 9/1992 | Khandros et al. |
| 5,148,266 A | 9/1992 | Khandros et al. |
| 5,186,381 A | 2/1993 | Kim |
| 5,189,505 A | 2/1993 | Bartelink |
| 5,196,726 A | 3/1993 | Nishiguchi et al. |
| 5,214,308 A | 5/1993 | Nishiguchi et al. |
| 5,220,489 A | 6/1993 | Barreto et al. |
| 5,222,014 A | 6/1993 | Lin |
| 5,340,771 A | 8/1994 | Rostoker |
| 5,371,654 A | 12/1994 | Beaman et al. |
| 5,397,997 A | 3/1995 | Tuckerman et al. |
| 5,438,224 A | 8/1995 | Papageorge et al. |
| 5,455,390 A | 10/1995 | DiStefano et al. |
| 5,494,667 A | 2/1996 | Uchida et al. |
| 5,495,667 A | 3/1996 | Farnworth et al. |
| 5,518,964 A | 5/1996 | DiStefano et al. |
| 5,531,022 A | 7/1996 | Beaman et al. |
| 5,536,909 A | 7/1996 | DiStefano et al. |
| 5,541,567 A | 7/1996 | Fogel et al. |
| 5,571,428 A | 11/1996 | Nishimura et al. |
| 5,615,824 A | 4/1997 | Fjelstad et al. |
| 5,635,846 A | 6/1997 | Beaman et al. |
| 5,656,550 A | 8/1997 | Tsuji et al. |
| 5,659,952 A | 8/1997 | Kovac et al. |
| 5,679,977 A | 10/1997 | Khandros et al. |
| 5,688,716 A | 11/1997 | DiStefano et al. |
| 5,726,493 A | 3/1998 | Yamashita et al. |
| 5,731,709 A | 3/1998 | Pastore et al. |
| 5,736,780 A | 4/1998 | Murayama |
| 5,787,581 A | 8/1998 | DiStefano et al. |
| 5,801,441 A | 9/1998 | DiStefano et al. |
| 5,802,699 A | 9/1998 | Fjelstad et al. |
| 5,811,982 A | 9/1998 | Beaman et al. |
| 5,821,763 A | 10/1998 | Beaman et al. |
| 5,831,836 A | 11/1998 | Long et al. |
| 5,854,507 A | 12/1998 | Miremadi et al. |
| 5,898,991 A | 5/1999 | Fogel et al. |
| 5,912,505 A | 6/1999 | Itoh et al. |
| 5,953,624 A | 9/1999 | Bando et al. |
| 5,971,253 A | 10/1999 | Gilleo et al. |
| 5,973,391 A | 10/1999 | Bischoff et al. |
| 5,977,618 A | 11/1999 | DiStefano et al. |
| 5,980,270 A | 11/1999 | Fjelstad et al. |
| 5,989,936 A | 11/1999 | Smith et al. |
| 5,994,152 A | 11/1999 | Khandros et al. |
| 6,002,168 A | 12/1999 | Bellaar et al. |
| 6,032,359 A | 3/2000 | Carroll |
| 6,038,136 A | 3/2000 | Weber |
| 6,052,287 A | 4/2000 | Palmer et al. |
| 6,054,337 A | 4/2000 | Solberg |
| 6,054,756 A | 4/2000 | DiStefano et al. |
| 6,077,380 A | 6/2000 | Hayes et al. |
| 6,117,694 A | 9/2000 | Smith et al. |
| 6,121,676 A | 9/2000 | Solberg |
| 6,124,546 A | 9/2000 | Hayward et al. |
| 6,133,072 A | 10/2000 | Fjelstad |
| 6,157,080 A | 12/2000 | Tamaki et al. |
| 6,158,647 A | 12/2000 | Chapman et al. |
| 6,164,523 A | 12/2000 | Fauty et al. |
| 6,177,636 B1 | 1/2001 | Fjelstad |
| 6,194,250 B1 | 2/2001 | Melton et al. |
| 6,194,291 B1 | 2/2001 | DiStefano et al. |
| 6,202,297 B1 | 3/2001 | Faraci et al. |
| 6,206,273 B1 | 3/2001 | Beaman et al. |
| 6,208,024 B1 | 3/2001 | DiStefano |
| 6,211,572 B1 | 4/2001 | Fjelstad et al. |
| 6,215,670 B1 | 4/2001 | Khandros |
| 6,218,728 B1 | 4/2001 | Kimura |
| 6,225,688 B1 | 5/2001 | Kim et al. |
| 6,258,625 B1 | 7/2001 | Brofman et al. |
| 6,260,264 B1 | 7/2001 | Chen et al. |
| 6,262,482 B1 | 7/2001 | Shiraishi et al. |
| 6,295,729 B1 | 10/2001 | Beaman et al. |
| 6,300,780 B1 | 10/2001 | Beaman et al. |
| 6,303,997 B1 | 10/2001 | Lee et al. |
| 6,313,528 B1 | 11/2001 | Solberg |
| 6,316,838 B1 | 11/2001 | Ozawa et al. |
| 6,332,270 B2 | 12/2001 | Beaman et al. |
| 6,334,247 B1 | 1/2002 | Beaman et al. |
| 6,358,627 B2 | 3/2002 | Benenati et al. |
| 6,362,520 B2 | 3/2002 | DiStefano |
| 6,362,525 B1 | 3/2002 | Rahim |
| 6,388,333 B1 | 5/2002 | Taniguchi et al. |
| 6,407,448 B2 | 6/2002 | Chun |
| 6,439,450 B1 | 8/2002 | Chapman et al. |
| 6,458,411 B1 | 10/2002 | Goossen et al. |
| 6,476,503 B1 | 11/2002 | Imamura et al. |
| 6,476,583 B2 | 11/2002 | McAndrews |
| 6,495,914 B1 | 12/2002 | Sekine et al. |
| 6,507,104 B2 | 1/2003 | Ho et al. |
| 6,509,639 B1 | 1/2003 | Lin |
| 6,514,847 B1 | 2/2003 | Ohsawa et al. |
| 6,515,355 B1 | 2/2003 | Jiang et al. |
| 6,522,018 B1 | 2/2003 | Tay et al. |
| 6,526,655 B2 | 3/2003 | Beaman et al. |
| 6,531,784 B1 | 3/2003 | Shim et al. |
| 6,545,228 B2 | 4/2003 | Hashimoto |
| 6,550,666 B2 | 4/2003 | Chew et al. |
| 6,555,918 B2 | 4/2003 | Masuda et al. |
| 6,560,117 B2 | 5/2003 | Moon |
| 6,573,458 B1 | 6/2003 | Matsubara et al. |
| 6,578,754 B1 | 6/2003 | Tung |
| 6,581,283 B2 | 6/2003 | Sugiura et al. |
| 6,624,653 B1 | 9/2003 | Cram |
| 6,630,730 B2 | 10/2003 | Grigg |
| 6,647,310 B1 | 11/2003 | Yi et al. |
| 6,684,007 B2 | 1/2004 | Yoshimura et al. |
| 6,687,988 B1 | 2/2004 | Sugiura et al. |
| 6,699,730 B2 | 3/2004 | Kim et al. |
| 6,708,403 B2 | 3/2004 | Beaman et al. |
| 6,730,544 B1 | 5/2004 | Yang |
| 6,734,542 B2 | 5/2004 | Nakatani et al. |
| 6,746,894 B2 | 6/2004 | Fee et al. |
| 6,762,078 B2 | 7/2004 | Shin et al. |
| 6,765,287 B1 | 7/2004 | Lin |
| 6,774,467 B2 | 8/2004 | Horiuchi et al. |
| 6,774,473 B1 | 8/2004 | Shen |
| 6,774,494 B2 | 8/2004 | Arakawa |
| 6,777,787 B2 | 8/2004 | Shibata |
| 6,790,757 B1 | 9/2004 | Chittipeddi et al. |
| 6,828,668 B2 | 12/2004 | Smith et al. |
| 6,844,619 B2 | 1/2005 | Tago |
| 6,856,235 B2 | 2/2005 | Fjelstad |
| 6,867,499 B1 | 3/2005 | Tabrizi |
| 6,900,530 B1 | 5/2005 | Tsai |
| 6,902,869 B2 | 6/2005 | Appelt et al. |
| 6,930,256 B1 | 8/2005 | Huemoeller et al. |
| 6,933,608 B2 | 8/2005 | Fujisawa |
| 6,946,380 B2 | 9/2005 | Takahashi |
| 6,962,282 B2 | 11/2005 | Manansala |
| 6,962,864 B1 | 11/2005 | Jeng et al. |
| 6,987,032 B1 | 1/2006 | Fan et al. |
| 7,009,297 B1 | 3/2006 | Chiang et al. |
| 7,045,884 B2 | 5/2006 | Standing |
| 7,061,079 B2 | 6/2006 | Weng et al. |
| 7,067,911 B1 | 6/2006 | Lin et al. |
| 7,119,427 B2 | 10/2006 | Kim |
| 7,170,185 B1 | 1/2007 | Hogerton et al. |
| 7,176,506 B2 | 2/2007 | Beroz et al. |
| 7,176,559 B2 | 2/2007 | Ho et al. |

(56) References Cited

U.S. PATENT DOCUMENTS

| | | | |
|---|---|---|---|
| 7,185,426 B1 | 3/2007 | Hiner et al. |
| 7,190,061 B2 | 3/2007 | Lee |
| 7,215,033 B2 | 5/2007 | Lee et al. |
| 7,225,538 B2 | 6/2007 | Eldridge et al. |
| 7,227,095 B2 | 6/2007 | Roberts et al. |
| 7,229,906 B2 | 6/2007 | Babinetz et al. |
| 7,233,057 B2 | 6/2007 | Hussa |
| 7,242,081 B1 | 7/2007 | Lee |
| 7,262,124 B2 | 8/2007 | Fujisawa |
| 7,323,767 B2 | 1/2008 | James et al. |
| 7,365,416 B2 | 4/2008 | Kawabata et al. |
| 7,371,676 B2 | 5/2008 | Hembree |
| 7,372,151 B1 | 5/2008 | Fan et al. |
| 7,391,105 B2 | 6/2008 | Yeom |
| 7,391,121 B2 | 6/2008 | Otremba |
| 7,416,107 B2 | 8/2008 | Chapman et al. |
| 7,456,091 B2 | 11/2008 | Kuraya et al. |
| 7,476,608 B2 | 1/2009 | Craig et al. |
| 7,476,962 B2 | 1/2009 | Kim |
| 7,485,562 B2 | 2/2009 | Chua et al. |
| 7,495,342 B2 | 2/2009 | Beaman et al. |
| 7,517,733 B2 | 4/2009 | Camacho et al. |
| 7,538,565 B1 | 5/2009 | Beaman et al. |
| 7,550,836 B2 | 6/2009 | Chou et al. |
| 7,576,439 B2 | 8/2009 | Craig et al. |
| 7,578,422 B2 | 8/2009 | Lange et al. |
| 7,621,436 B2 | 11/2009 | Mii et al. |
| 7,633,765 B1 | 12/2009 | Scanlan et al. |
| 7,642,133 B2 | 1/2010 | Wu et al. |
| 7,646,102 B2 | 1/2010 | Boon |
| 7,671,457 B1 | 3/2010 | Hiner et al. |
| 7,671,459 B2 | 3/2010 | Corisis et al. |
| 7,675,152 B2 | 3/2010 | Gerber et al. |
| 7,677,429 B2 | 3/2010 | Chapman et al. |
| 7,682,962 B2 | 3/2010 | Hembree |
| 7,728,443 B2 | 6/2010 | Hembree |
| 7,737,545 B2 | 6/2010 | Fjelstad et al. |
| 7,757,385 B2 | 7/2010 | Hembree |
| 7,777,351 B1 | 8/2010 | Berry et al. |
| 7,780,064 B2 | 8/2010 | Wong et al. |
| 7,795,717 B2 * | 9/2010 | Goller .................... 257/686 |
| 7,808,093 B2 | 10/2010 | Kagaya et al. |
| 7,842,541 B1 | 11/2010 | Rusli et al. |
| 7,850,087 B2 | 12/2010 | Hwang et al. |
| 7,855,462 B2 | 12/2010 | Boon et al. |
| 7,880,290 B2 | 2/2011 | Park |
| 7,892,889 B2 | 2/2011 | Howard et al. |
| 7,919,846 B2 | 4/2011 | Hembree |
| 7,932,170 B1 | 4/2011 | Huemoeller et al. |
| 7,934,313 B1 | 5/2011 | Lin et al. |
| 7,964,956 B1 | 6/2011 | Bet-Shliemoun |
| 7,967,062 B2 | 6/2011 | Campbell et al. |
| 7,977,597 B2 | 7/2011 | Roberts et al. |
| 8,012,797 B2 | 9/2011 | Shen et al. |
| 8,020,290 B2 | 9/2011 | Sheats |
| 8,039,970 B2 | 10/2011 | Yamamori et al. |
| 8,071,470 B2 | 12/2011 | Khor et al. |
| 8,084,867 B2 | 12/2011 | Tang et al. |
| 8,093,697 B2 | 1/2012 | Haba et al. |
| 8,213,184 B2 | 7/2012 | Knickerbocker |
| 8,217,502 B2 | 7/2012 | Ko |
| 8,232,141 B2 | 7/2012 | Choi et al. |
| 8,304,900 B2 | 11/2012 | Jang et al. |
| 2001/0002607 A1 | 6/2001 | Sugiura et al. |
| 2001/0007370 A1 | 7/2001 | Distefano |
| 2001/0021541 A1 | 9/2001 | Akram et al. |
| 2001/0028114 A1 | 10/2001 | Hosomi |
| 2002/0014004 A1 | 2/2002 | Beaman et al. |
| 2002/0066952 A1 | 6/2002 | Taniguchi et al. |
| 2002/0117330 A1 | 8/2002 | Eldridge et al. |
| 2002/0125571 A1 | 9/2002 | Corisis et al. |
| 2002/0153602 A1 | 10/2002 | Tay et al. |
| 2002/0164838 A1 | 11/2002 | Moon et al. |
| 2002/0185735 A1 | 12/2002 | Sakurai et al. |
| 2003/0006494 A1 | 1/2003 | Lee et al. |
| 2003/0048108 A1 | 3/2003 | Beaman et al. |
| 2003/0057544 A1 | 3/2003 | Nathan et al. |
| 2003/0094700 A1 | 5/2003 | Aiba et al. |
| 2003/0106213 A1 | 6/2003 | Beaman et al. |
| 2003/0124767 A1 | 7/2003 | Lee et al. |
| 2003/0162378 A1 | 8/2003 | Mikami |
| 2003/0164540 A1 | 9/2003 | Lee et al. |
| 2004/0036164 A1 | 2/2004 | Koike et al. |
| 2004/0038447 A1 | 2/2004 | Corisis et al. |
| 2004/0075164 A1 | 4/2004 | Pu et al. |
| 2004/0090756 A1 | 5/2004 | Ho et al. |
| 2004/0110319 A1 | 6/2004 | Fukutomi et al. |
| 2004/0119152 A1 | 6/2004 | Karnezos et al. |
| 2004/0124518 A1 | 7/2004 | Karnezos |
| 2004/0148773 A1 | 8/2004 | Beaman et al. |
| 2004/0152292 A1 | 8/2004 | Babinetz et al. |
| 2004/0160751 A1 | 8/2004 | Inagaki et al. |
| 2004/0188499 A1 | 9/2004 | Nosaka |
| 2004/0262734 A1 | 12/2004 | Yoo |
| 2005/0035440 A1 | 2/2005 | Mohammed |
| 2005/0062492 A1 | 3/2005 | Beaman et al. |
| 2005/0082664 A1 | 4/2005 | Funaba et al. |
| 2005/0095835 A1 | 5/2005 | Humpston et al. |
| 2005/0116326 A1 | 6/2005 | Haba et al. |
| 2005/0121764 A1 | 6/2005 | Mallik et al. |
| 2005/0133916 A1 | 6/2005 | Karnezos |
| 2005/0133932 A1 | 6/2005 | Pohl et al. |
| 2005/0140265 A1 | 6/2005 | Hirakata |
| 2005/0151235 A1 | 7/2005 | Yokoi |
| 2005/0151238 A1 | 7/2005 | Yamunan |
| 2005/0173805 A1 | 8/2005 | Damberg et al. |
| 2005/0173807 A1 | 8/2005 | Zhu et al. |
| 2005/0181544 A1 | 8/2005 | Haba et al. |
| 2005/0181655 A1 | 8/2005 | Haba et al. |
| 2005/0212109 A1 | 9/2005 | Cherukuri et al. |
| 2005/0266672 A1 | 12/2005 | Jeng et al. |
| 2005/0285246 A1 | 12/2005 | Haba et al. |
| 2006/0118641 A1 | 6/2006 | Hwang et al. |
| 2006/0166397 A1 | 7/2006 | Lau et al. |
| 2006/0197220 A1 | 9/2006 | Beer |
| 2006/0278682 A1 | 12/2006 | Lange et al. |
| 2007/0015353 A1 | 1/2007 | Craig et al. |
| 2007/0148822 A1 | 6/2007 | Haba et al. |
| 2007/0181989 A1 | 8/2007 | Corisis et al. |
| 2007/0190747 A1 | 8/2007 | Humpston et al. |
| 2007/0271781 A9 | 11/2007 | Beaman et al. |
| 2007/0290325 A1 | 12/2007 | Wu et al. |
| 2008/0017968 A1 | 1/2008 | Choi et al. |
| 2008/0032519 A1 | 2/2008 | Murata |
| 2008/0047741 A1 | 2/2008 | Beaman et al. |
| 2008/0048309 A1 | 2/2008 | Corisis et al. |
| 2008/0048690 A1 | 2/2008 | Beaman et al. |
| 2008/0048691 A1 | 2/2008 | Beaman et al. |
| 2008/0048697 A1 | 2/2008 | Beaman et al. |
| 2008/0054434 A1 | 3/2008 | Kim |
| 2008/0073769 A1 | 3/2008 | Wu et al. |
| 2008/0073771 A1 | 3/2008 | Seo et al. |
| 2008/0076208 A1 | 3/2008 | Wu et al. |
| 2008/0100316 A1 | 5/2008 | Beaman et al. |
| 2008/0100317 A1 | 5/2008 | Beaman et al. |
| 2008/0100318 A1 | 5/2008 | Beaman et al. |
| 2008/0100324 A1 | 5/2008 | Beaman et al. |
| 2008/0106281 A1 | 5/2008 | Beaman et al. |
| 2008/0106282 A1 | 5/2008 | Beaman et al. |
| 2008/0106283 A1 | 5/2008 | Beaman et al. |
| 2008/0106284 A1 | 5/2008 | Beaman et al. |
| 2008/0106285 A1 | 5/2008 | Beaman et al. |
| 2008/0106291 A1 | 5/2008 | Beaman et al. |
| 2008/0106872 A1 | 5/2008 | Beaman et al. |
| 2008/0111568 A1 | 5/2008 | Beaman et al. |
| 2008/0111569 A1 | 5/2008 | Beaman et al. |
| 2008/0111570 A1 | 5/2008 | Beaman et al. |
| 2008/0112144 A1 | 5/2008 | Beaman et al. |
| 2008/0112145 A1 | 5/2008 | Beaman et al. |
| 2008/0112146 A1 | 5/2008 | Beaman et al. |
| 2008/0112147 A1 | 5/2008 | Beaman et al. |
| 2008/0112148 A1 | 5/2008 | Beaman et al. |
| 2008/0112149 A1 | 5/2008 | Beaman et al. |
| 2008/0116912 A1 | 5/2008 | Beaman et al. |

(56) References Cited

U.S. PATENT DOCUMENTS

| | | |
|---|---|---|
| 2008/0116913 A1 | 5/2008 | Beaman et al. |
| 2008/0116914 A1 | 5/2008 | Beaman et al. |
| 2008/0116915 A1 | 5/2008 | Beaman et al. |
| 2008/0116916 A1 | 5/2008 | Beaman et al. |
| 2008/0117611 A1 | 5/2008 | Beaman et al. |
| 2008/0117612 A1 | 5/2008 | Beaman et al. |
| 2008/0117613 A1 | 5/2008 | Beaman et al. |
| 2008/0121879 A1 | 5/2008 | Beaman et al. |
| 2008/0123310 A1 | 5/2008 | Beaman et al. |
| 2008/0129319 A1 | 6/2008 | Beaman et al. |
| 2008/0129320 A1 | 6/2008 | Beaman et al. |
| 2008/0132094 A1 | 6/2008 | Beaman et al. |
| 2008/0156518 A1 | 7/2008 | Honer et al. |
| 2008/0164595 A1 | 7/2008 | Wu et al. |
| 2008/0211084 A1 | 9/2008 | Chow et al. |
| 2008/0284045 A1 | 11/2008 | Gerber et al. |
| 2008/0303153 A1 | 12/2008 | Oi et al. |
| 2008/0315385 A1 | 12/2008 | Gerber et al. |
| 2009/0026609 A1 | 1/2009 | Masuda |
| 2009/0050994 A1 | 2/2009 | Ishihara et al. |
| 2009/0085185 A1 | 4/2009 | Byun et al. |
| 2009/0085205 A1 | 4/2009 | Sugizaki |
| 2009/0091009 A1 | 4/2009 | Corisis et al. |
| 2009/0102063 A1 | 4/2009 | Lee et al. |
| 2009/0104736 A1 | 4/2009 | Haba et al. |
| 2009/0127686 A1 | 5/2009 | Yang et al. |
| 2009/0128176 A1 | 5/2009 | Beaman et al. |
| 2009/0160065 A1 | 6/2009 | Haba et al. |
| 2009/0189288 A1 | 7/2009 | Beaman et al. |
| 2009/0206461 A1 | 8/2009 | Yoon |
| 2009/0212442 A1 | 8/2009 | Chow et al. |
| 2009/0236700 A1 | 9/2009 | Moriya |
| 2009/0236753 A1 | 9/2009 | Moon et al. |
| 2009/0261466 A1 | 10/2009 | Pagaila et al. |
| 2009/0315579 A1 | 12/2009 | Beaman et al. |
| 2010/0007009 A1 | 1/2010 | Chang et al. |
| 2010/0025835 A1 | 2/2010 | Oh et al. |
| 2010/0052135 A1 | 3/2010 | Shim et al. |
| 2010/0078789 A1 | 4/2010 | Choi et al. |
| 2010/0078795 A1 | 4/2010 | Dekker et al. |
| 2010/0090330 A1 | 4/2010 | Nakazato |
| 2010/0117212 A1 | 5/2010 | Corisis et al. |
| 2010/0133675 A1 | 6/2010 | Yu et al. |
| 2010/0224975 A1 | 9/2010 | Shin et al. |
| 2010/0232129 A1 | 9/2010 | Haba et al. |
| 2010/0314748 A1 | 12/2010 | Hsu et al. |
| 2011/0068453 A1 | 3/2011 | Cho et al. |
| 2011/0115081 A1 | 5/2011 | Osumi |
| 2011/0140259 A1 | 6/2011 | Cho et al. |
| 2011/0241193 A1 | 10/2011 | Ding et al. |
| 2011/0272449 A1 | 11/2011 | Pirkle et al. |
| 2012/0043655 A1 | 2/2012 | Khor et al. |
| 2012/0119380 A1* | 5/2012 | Haba ............................ 257/774 |

FOREIGN PATENT DOCUMENTS

| | | |
|---|---|---|
| JP | 61125062 A | 6/1986 |
| JP | 62-226307 | 10/1987 |
| JP | 1012769 A | 1/1989 |
| JP | 64-71162 | 3/1989 |
| JP | 62-68015 A | 9/1994 |
| JP | 07-122787 A | 5/1995 |
| JP | 11-074295 A | 3/1999 |
| JP | 11135663 A | 5/1999 |
| JP | 2001196407 A | 7/2001 |
| JP | 2002289769 A | 10/2002 |
| JP | 2003122611 A | 4/2003 |
| JP | 2003-174124 | 6/2003 |
| JP | 2003307897 A | 10/2003 |
| JP | 2004281514 A | 10/2004 |
| JP | 2004327856 A | 11/2004 |
| JP | 2004343030 A | 12/2004 |
| JP | 2005011874 A | 1/2005 |
| JP | 2003377641 A | 6/2005 |
| JP | 2005142378 A | 6/2005 |
| JP | 2003426392 A | 7/2005 |
| JP | 2005183880 A | 7/2005 |
| JP | 2005203497 A | 7/2005 |
| JP | 2005302765 A | 10/2005 |
| JP | 2007123595 A | 5/2007 |
| JP | 2007287922 A | 11/2007 |
| JP | 2008251794 A | 10/2008 |
| JP | 2009004650 A | 1/2009 |
| JP | 2009260132 A | 11/2009 |
| JP | 2010103129 A | 5/2010 |
| JP | 2010206007 A | 9/2010 |
| KR | 100265563 | 9/2000 |
| KR | 2001-0094894 A | 11/2001 |
| KR | 10-0393102 | 7/2002 |
| KR | 20020058216 A | 7/2002 |
| KR | 20060064291 A | 6/2006 |
| KR | 20080020069 A | 3/2008 |
| KR | 100865125 B1 | 10/2008 |
| KR | 20080094251 A | 10/2008 |
| KR | 100886100 B1 | 2/2009 |
| KR | 20090033605 A | 4/2009 |
| KR | 20100033012 A | 3/2010 |
| KR | 20100062315 A | 6/2010 |
| KR | 101011863 B1 | 1/2011 |
| WO | 02/13256 A1 | 2/2002 |
| WO | 2006050691 A2 | 5/2006 |
| WO | 2008065896 A1 | 6/2008 |

OTHER PUBLICATIONS

Redistributed Chip Package (RCP) Technology, Freescale Semiconductor, 2005, 6 pages.
"Wafer Level Stack—WDoD", [online]. [Retrieved Aug. 5, 2010]. Retrieved from the internet. <http://www.3d-plus.com/techno-wafer-level-stack-wdod.php>, 2 pages.
Jin, Yonggang et al., "STM 3D-IC Package and 3D eWLB Development," STMicroelectronics Singapore/STMicroelectronics France.
Yoon, PhD, Seung Wook, "Next Generation Wafer Level Packaging Solution for 3D integration," May 2010, STATS ChipPAC LTD.
Search Report from Korean Patent Applicatin No. 10-2010-0113271 dated Jan. 12, 2011.
International Search Report and Written Opinion for PCT/US2011/060551 dated Apr. 18, 2012.
Bang, U.S. Appl. No. 10/656,534, filed Sep. 5, 2003.
International Search Report and Written Opinion for Application No. PCT/US2011/044346 dated May 11, 2012.
International Search Report and Written Opinion PCT/US2011/044342 dated May 7, 2012.
International Search Report Application No. PCT/US2011/024143, dated Sep. 14, 2011.
International Search Report, PCT/US2005/039716, Apr. 5, 2006.
Kim et al., "Application of Through Mold Via (TMV) as PoP base package", 6 pages (2008).
Kim, et al., Application of Through Mold Via (TMV) as PoP base package, ECTC, 2008.
Korean Office Action for Application No. 10-2011-0041843 dated Jun. 20, 2011.
Korean Search Report KR10-2011-0041843 dated Feb. 24, 2011.
Neo-Manhattan Technology, A Novel HDI Manufacturing Process, "High-Density Interconnects for Advanced Flex Substrates & 3-D Package Stacking," IPC Flex & Chips Symposium, Tempe, AZ, Feb. 11-12, 2003.
North Corporation, "Processed Intra-layer Interconnection Material for PWBs [Etched Copper Bump with Copper Foil]," NMBITM, Version 2001.6.
Office Action from U.S. Appl. No. 12/769,930 mailed May 5, 2011.
Partial International Search Report from Invitation to Pay Additional Fees for Application No. PCT/US2012/028738 dated Jun. 6, 2012.
Meiser S, "Klein Und Komplex", Elektronik, IRL Press Limited, DE, vol. 41, No. 1, Jan. 7, 1992, pp. 72-77, XP000277326. (International Search Report for Application No. PCT/US2012/060402 dated Feb. 21, 2013 provides concise statement of relevance.).
Partial International Search Report for Application No. PCT/US2012/060402 dated Feb. 21, 2013.

(56) References Cited

OTHER PUBLICATIONS

International Seacrh Report and Written Opinion for Application No. PCT/US2012/060402 dated Apr. 2, 2013.

Partial International Search Report for Application No. PCT/US2013/026126 dated Jun. 17, 2013.

Extended European Search Report for Application No. EP13162975 dated Sep. 5, 2013.

Japanese Office Action for Application No. 2013-509325 dated Oct. 18, 2013.

* cited by examiner

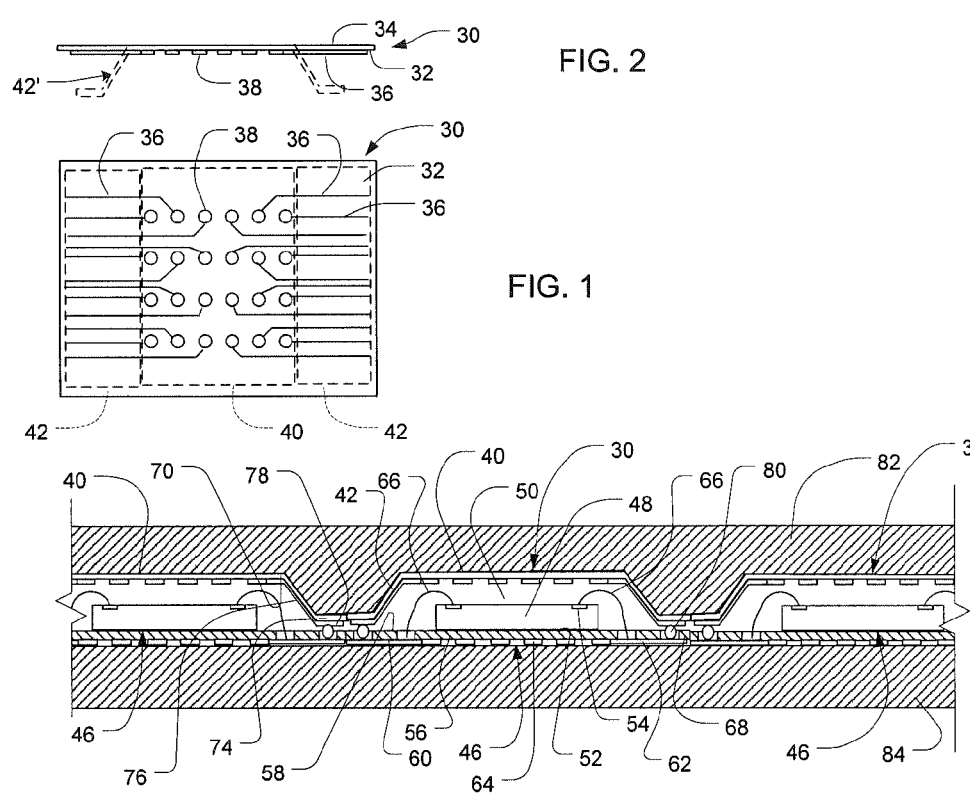

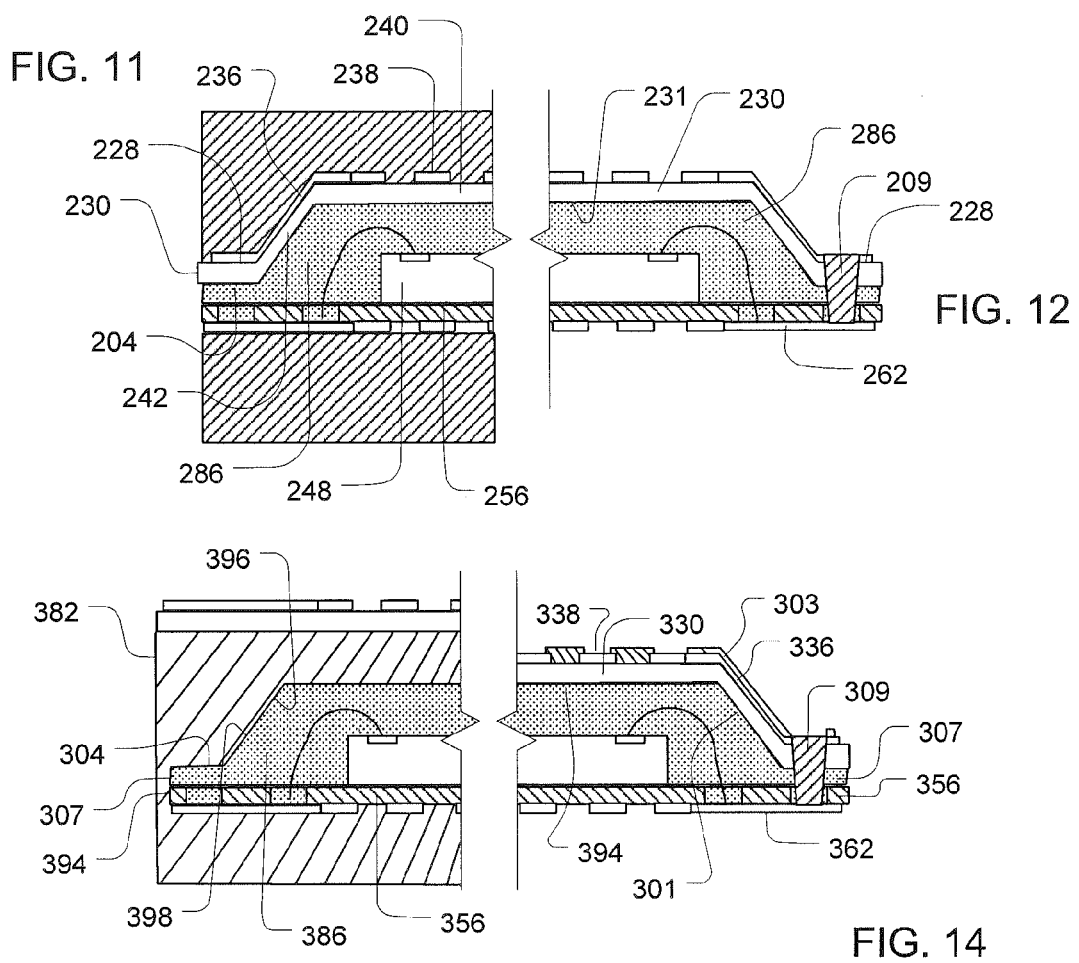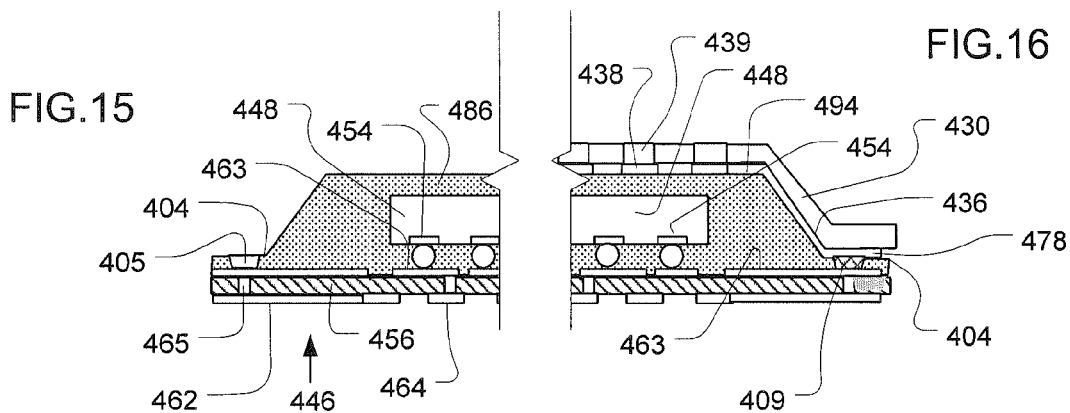

MICROELECTRONIC PACKAGE WITH TERMINALS ON DIELECTRIC MASS

CROSS-REFERENCE TO RELATED APPLICATIONS

The present application is a continuation of U.S. patent application Ser. No. 13/295,608 filed Nov. 14, 2011, which claims priority from Korean Patent Application No. 10-2010-0113271 filed Nov. 15, 2010, all of which are incorporated herein by reference.

FIELD OF THE INVENTION

The present invention relates to microelectronic packaging.

BACKGROUND OF THE INVENTION

Microelectronic elements such as semiconductor chips commonly are provided with elements which protect the microelectronic element and facilitate its connection to other elements of a larger circuit. For example, a semiconductor chip typically is provided as a small, flat element having oppositely facing front and rear surfaces and contacts exposed at the front surface. The contacts are electrically connected to the numerous electronic circuit elements formed integrally within the chip. Such a chip most commonly is provided in a package having a miniature circuit panel referred to as a package substrate. The chip is typically mounted to the package substrate with the front or rear surface overlying a surface of the package substrate, and the package substrate typically has terminals exposed at a surface of the substrate. The terminals are electrically connected to the contacts of the chip. The package typically also includes some form of covering overlying the chip on the side of the chip opposite from the package substrate. The covering serves to protect the chip and, in some cases, the connections between the chip and the conductive elements of the package substrate. Such a packaged chip can be mounted to a circuit panel such as a circuit board by connecting the terminals of the package substrate to conductive elements such as contact pads on the larger circuit panel.

In certain packages, the chip is mounted with its front or back surface overlying an upper surface of the package substrate, whereas terminals are provided on the oppositely facing lower surface. A mass of a dielectric material overlies the chip and, most typically, the electrical connections between the chip and the conductive elements of the package substrate. The dielectric mass can be formed by molding a flowable dielectric composition around the chip so that the dielectric composition covers the chip and all or part of the top surface of the package substrate. Such a package is commonly referred to as an "overmolded" package, and the mass of dielectric material is referred to as the "overmold." Overmolded packages are economical to manufacture and thus are widely used.

In some applications, it is desirable to stack chip packages on top of one another, so that plural chips can be provided in the same space on the surface of the larger circuit panel. Certain overmolded packages incorporate stacking contacts exposed at the top surface of the package substrate outside of the area covered by the chip and, typically, outside of the area covered by the overmold. Such packages can be stacked one atop the other with interconnecting elements such as solder balls or other conductive connections extending between the stacking contacts of the lower package and the terminals of the next higher package in the stack. In such an arrangement, all of the packages in the stack are electrically connected to the terminals on package at the bottom of the stack. In such an arrangement, however, all of the interconnecting elements must be accommodated in the limited region of the package substrate outside of the area covered by the overmold. Moreover, because the package substrate of the higher package in the stack sits above the dielectric overmold in the next lower package, there is an appreciable gap in the vertical direction between the terminals of the higher package and the stacking contacts of the lower package. The interconnecting elements must bridge this gap. This typically requires interconnecting elements spaced at relatively large intervals. Therefore, the number of interconnecting elements which can be accommodated using package substrate of a given size is limited.

Despite the considerable effort devoted in the art to development of stackable packages and other packages having top-surface mounting pads, further improvement would be desirable.

BRIEF SUMMARY OF THE INVENTION

One aspect of the invention provides a microelectronic package. A package according to this aspect of the invention desirably includes a first microelectronic element as well as a package substrate having upper and lower surfaces extending in horizontal directions and edges extending between the upper and lower surfaces. Desirably, the package substrate has electrically conductive elements including bottom terminals exposed at the lower surface of the package substrate. The microelectronic element preferably is disposed over the upper surface of the package substrate and connected to at least some of the conductive elements on the package substrate. The package according to this aspect of the invention preferably includes a dielectric mass covering the microelectronic element and at least part of the upper surface of the package substrate. The dielectric mass defines a top surface remote from the package substrate facing away from the package substrate. Preferably, at least a part of the top surface extends over the microelectronic element. The dielectric mass desirably also defines a first edge surface extending downwardly from a top border adjacent the top surface of the dielectric mass to a bottom border adjacent the package substrate, the bottom border being disposed inside the edges of the package substrate. Preferably, the dielectric mass further defines an upwardly-facing first flange surface extending away from the bottom border of the first edge surface in a horizontal direction adjacent the package substrate, the first flange surface being disposed at a vertical distance from the package substrate less than a vertical distance between the package substrate and the top surface.

Most preferably, the package includes a plurality of top terminals exposed at the top surface of the dielectric mass and a plurality of first traces extending from the top terminals along the top surface and extending along the first edge surface, the first traces having bottom portions adjacent the package substrate extending along the flange surface, the bottom portions being electrically connected to the conductive elements of the package substrate.

As further discussed below, certain packages according to this aspect of the invention can provide numerous top terminals connected to numerous conductive elements on the package substrate. These packages can be used, for example, in a stacked arrangement wherein the top terminals of one package are connected to the bottom terminals of another package.

A package according to a further aspect of the invention desirably includes a microelectronic element and a package substrate having upper and lower surfaces extending in horizontal directions, the microelectronic element being disposed over the upper surface of the package substrate. Desirably, the microelectronic element is electrically connected to at least some conductive elements on the package substrate. The package according to this aspect of the invention desirably includes an overmold covering the microelectronic element and at least part of the upper surface of the microelectronic element, the overmold defining a top surface remote from the package substrate facing away from the package substrate, at least a part of the overmold top surface extending over the microelectronic element. The package desirably further includes top terminals exposed at the top surface of the overmold; and a plurality of traces extending from the top terminals along the top surface of the overmold, the top terminals and traces being embedded in the overmold. Most preferably, the traces are solid metal traces.

Further aspects of the invention provide systems which incorporate packages according to the foregoing aspects of the invention in conjunction with other electronic devices. For example, the system may be disposed in a single housing, which may be a portable housing.

Still further aspects of the invention provide methods of making microelectronic packages. One such method includes steps of a positioning a carrier such as a sheet bearing a plurality of traces over an assemblage of a package substrate with conductive elements and a microelectronic element overlying the package substrate and electrically connected to the conductive elements, the positioning step being conducted so that portions of at least some of the traces extend over the microelectronic element. The method desirably also includes the step of introducing a flowable composition between the carrier and the package substrate and around the microelectronic element and curing the composition to form an overmold covering the microelectronic element and having a shape at least partially defined by the carrier. Preferably, the method also includes removing the carrier so as to leave the traces extending over one or more surfaces of the overmold facing away from the package substrate.

A further method according to this aspect of the invention desirably includes the step of positioning a carrier such as a sheet bearing a plurality of traces over an assemblage of a package substrate with conductive elements and a microelectronic element overlying the package substrate and electrically connected to the conductive elements. In this method, the positioning step desirably is performed so that a first portion of the carrier and first portions of the traces on the first portion of the carrier extend over the microelectronic element and a second portion of the carrier and second portions of the traces on the second portion of the carrier extend from the first portion toward the package substrate. For example, the carrier may be a sheet with traces thereon, and the sheet may be bent or otherwise deformed so that the second portion of the carrier projects from the first portion of the carrier toward the package substrate.

This method desirably also includes the steps of introducing a flowable composition between the sheet and the package substrate and around the microelectronic element and curing the composition to form an overmold covering the microelectronic element and having a shape at least partially defined by the carrier. Most preferably, the method includes electrically connecting the second portions of the traces with the conductive elements of the package substrate. The connecting step can be performed before or after the overmold is formed. In either case, the proximity of the second portions of the traces to the package substrate facilitates formation of small connections, which in turn helps to provide numerous traces in a package of limited size.

A further method of making a microelectronic package includes the step depositing a conformal dielectric layer onto an assemblage of a package substrate with conductive elements including bottom terminals exposed at a lower surface of the package substrate and a microelectronic element overlying an upper surface of the package substrate and electrically connected to the conductive elements. Desirably, the depositing step is performed so that a first portion of the conformal layer defines a top surface remote from the package substrate and extending over the microelectronic element and one or more additional portions of the conformal layer define one or more edge surfaces extending downwardly toward the package substrate outside of an area covered by the microelectronic element. The method desirably includes providing traces and top terminals on the conformal layer so that the traces extend along the top surface and extend toward the package substrate along at least one edge surface and bottom portions of the traces are positioned adjacent the package substrate. Desirably, the method further includes connecting the bottom portions of the traces to at least some of the conductive elements on the package substrate.

BRIEF DESCRIPTION OF THE DRAWINGS

FIG. 1 is a diagrammatic bottom plan view of a component used in a method of manufacturing a package according to one embodiment of the invention.

FIG. 2 is a diagrammatic elevational view of the component depicted in FIG. 1.

FIG. 3 is a diagrammatic sectional view depicting a manufacturing step using the component of FIGS. 1 and 2.

FIG. 11 is a fragmentary sectional view depicting a portion of a manufacturing process according to a further embodiment of the invention.

FIG. 12 is a fragmentary sectional view depicting a portion of the package made in the process of FIG. 11.

FIG. 13 is a fragmentary sectional view depicting a stage in a manufacturing process according to yet another embodiment of the invention.

FIG. 14 is a fragmentary sectional view depicting a portion of the package made using the process of FIG. 13.

FIG. 15 is a fragmentary sectional view depicting a stage in a manufacturing process according to yet another embodiment of the invention.

FIG. 16 is a fragmentary sectional view depicting a portion of the package made in the process of FIG. 15.

DETAILED DESCRIPTION

Figure 4:
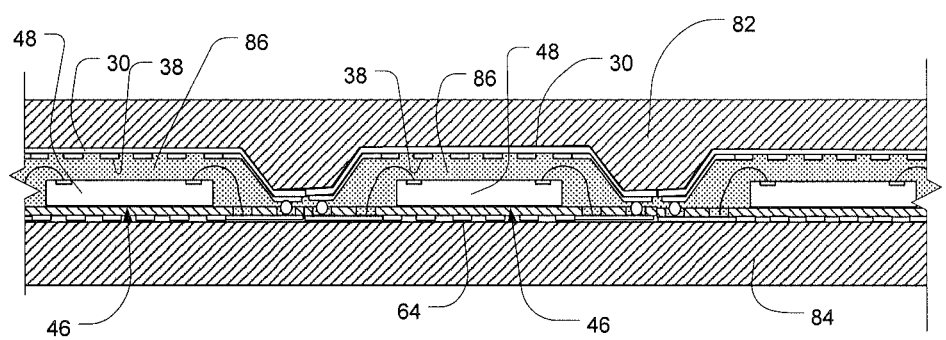
FIG. 4 is a diagrammatic sectional view similar to FIG. 3, but depicting the component and associated elements at a later stage in the manufacturing process.

A component utilized in a manufacturing process according to one embodiment of the invention incorporates a carrier in the form of a metallic sheet 30 as, for example, a sheet of copper (FIGS. 1 and 2) having a first surface 32 and an opposite second surface 34. The first surface 32 bears a plurality of electrically conductive traces 36. The traces are formed as elongated strips of a conductive material, preferably a solid metal such as copper, gold, nickel, and combinations thereof on the first surface 32 of sheet 30. The traces are formed integrally with terminals 38 of similar composition. The terminals are disposed in a first portion 40 of the sheet, schematically indicated by a broken line. The traces extend from the terminals into a second portion 42. In this embodiment, second portion 42 includes regions on opposite sides of the first portion 40. Although only a few terminals 38 and a few traces 36 are depicted in FIGS. 1 and 2, in practice, there can be hundreds or more terminals and traces.

Terminals 38 are disposed in an "area array" within first portion 40. As used in this disclosure, the term "area array" means an array of terminals in which the terminals are substantially dispersed over a two-dimensional region, rather than concentrated in a few rows such as rows only at the perimeter of the region or rows only in the center of the region. Although the particular area array shown in FIG. 1 is a rectilinear, uniform array, this is not essential.

The terminals and traces can be fabricated by numerous known metal working methods as, for example, by etching a sheet originally having a thickness greater than sheet 30 so as to remove metal from areas other than those occupied by the terminals and traces, or by plating the terminals and traces onto the sheet. FIGS. 1 and 2 depict only a single sheet of a size suitable for making a single package. In practice, however, the sheet desirably is provided as a continuous or semi-continuous element incorporating numerous portions, each such portion constituting the sheet shown in FIGS. 1 and 2, these portions being continuous with one another.

The sheet according to FIGS. 1 and 2 is utilized in conjunction with an assemblage 46 (FIG. 3) incorporating a microelectronic element 48 such as a semiconductor chip having a front surface 50, a rear surface 52, and contacts 54 exposed at the front surface. Assemblage 46 also includes a package substrate in the form of a small circuit panel incorporating a generally planar dielectric structure 56 having a top surface 58 and an oppositely facing bottom surface 60. The words "top" and "bottom" as used herein refer to the frame of reference of the elements discussed and do not refer to the normal gravitational frame of reference. Package substrate 56 also includes conductive elements which, in this instance, incorporate traces 62 extending on the bottom surface 60 and terminals 64 also exposed at the bottom surface of the dielectric structure and connected to traces 62.

The assemblage also includes wire bonds 66 connecting the contacts 54 of chip 48 with traces 62 on the package substrate. The package substrate has apertures 68 arranged so that traces 62 are exposed at the upper surface of the package substrate through apertures 68. In the particular embodiment depicted in FIG. 3, the package substrates of numerous assemblages are provided as a continuous or semi-continuous element such as a strip, tape or sheet. Thus, although there are visible borders between the individual package substrates 56 in FIG. 3 for clarity of illustration, in practice, there may be no discernable borders at this stage of the process. The apertures 68 in the package substrate 46 desirably are fully closed by the traces 62. Likewise, the apertures where wire bonds 66 penetrate to the traces desirably are fully covered by the traces, so that the package substrate is a continuous, impervious sheet.

In a step of the method, the element including numerous carriers or sheets 30 is positioned over the element including numerous assemblages 46 with their package substrates and chips. Each carrier or sheet 30 is positioned so that the first surface 32 bearing traces 36 and terminals 38 faces toward the package substrates. In the embodiment of FIG. 3, the positioning step includes deforming each carrier sheet 30 from the flat condition depicted in FIGS. 1 and 2 to a deformed condition in which the second portion 42 of each sheet is bent out of plane from the first portion 40, with the second portion 42 projecting in the direction of first surface 32 as indicated schematically at 42' in FIG. 2. This may be done by essentially any conventional forming technology as, for example, by use of a matched metal die in a stamping press. The formed carrier sheets are positioned over the assemblages of chips and package substrates so that the first portion 40 of the carrier sheet 30 (FIG. 1) bearing terminals 38 extends over the microelectronic element or chip 48 and the second portion 42 extends from the first portion 40 toward the package substrate 46.

In this condition, the second portions 42 of the each carrier sheet 30 define sloping regions 70 extending from the first portion 40 of the sheet, and also define flange regions 74 projecting from the sloping regions 70. The traces in the second portions 42 extend along the sloping regions 70 and also extend along the flange regions 74. Thus, those portions of the traces 36 in the second portions 42 of the sheet include slope portions 76 extending along the sloping regions 70 and bottom portions 78 extending on the flange portions 74.

With the carrier sheets 30 positioned over the package substrate 46, the bottom portions 78 of the traces and the flange regions 74 of the sheet are disposed close to the package substrate 46. The bottom portions 78 of the traces on the sheet are connected to the traces 62 on the package substrate by any suitable connection as, for example, by solder bonds 80. The positions of the traces on the carrier sheet 30 and the positions of the conductive features on the package substrate 56 can be controlled with excellent accuracy. This facilitates the bonding process and facilitates the use of small-diameter bonds which allow close spacing of the traces.

After the traces on the carrier sheets have been bonded to the traces on the package substrates, the assembled parts are placed into a mold, so that a first side 82 of the mold supports the carrier sheets 30, whereas a second side 84 of the mold supports the package substrates 46. Although the mold parts are depicted as closely overlying the carrier sheets and package substrates, there is no need for sealing engagement between the mold parts and the carrier sheets 30 or package substrates 46. Rather, the mold parts serve to physically support the carrier sheets and package substrates and prevent distortion of these elements during the molding step discussed below.

In the next step (FIG. 4), a flowable composition as, for example, an epoxy is introduced into the space between each carrier sheet 30 and the associated package substrate 46 and around the chip or microelectronic element 48 on the package substrate. This flowable composition is cured to form an overmold 86 (FIG. 4). As the flowable composition is introduced, it contacts the carrier sheet and thus assumes a shape defined at least partially by the carrier sheet. Also, the flowable composition flows into intimate contact with the traces and terminals and partially surrounds the traces and terminals. However, because the carrier sheet 30 is in intimate contact with the surfaces of the traces and, particularly, the terminals 38, the faces of the terminals facing toward the carrier sheet are fully protected from contact with the flowable composition. Also, the package substrate 46 protects the terminals 64 on the package substrate from contamination by the flowable composition. Because the carrier sheets 30 and package substrates 46 are provided as continuous or semi-continuous sheets, there is no need for the mold parts to confine the flowable composition at the margins of any one particular carrier sheet or package substrate. The flowable composition may be introduced into the space between one carrier sheet and package substrate and may flow into the spaces between other carrier sheets and package substrates.

Figure 5:
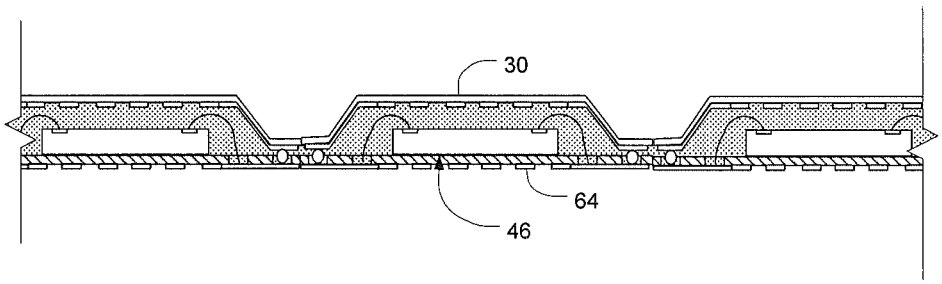
FIG. 5 is a diagrammatic sectional view similar to FIGS. 3 and 4, depicting the component and associated elements at a later stage in the manufacturing operation.
Figure 6:
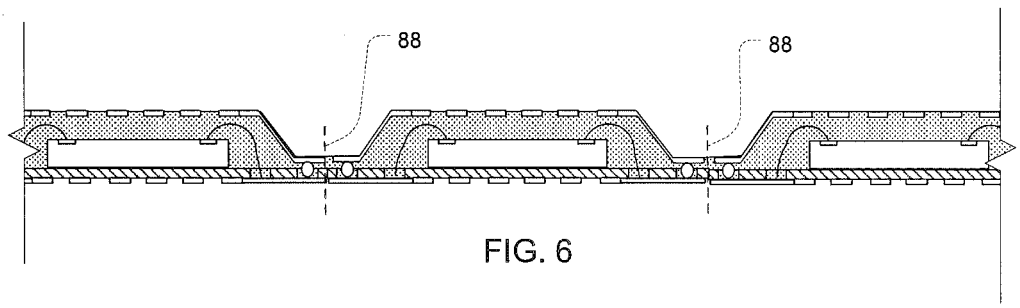
FIG. 6 is a view similar to FIGS. 3-5, but depicting a still later stage in manufacture.

In the next phase of the process, the mold elements 82 and 84 are removed, leaving the carrier sheets 30 exposed on one side of the molded assemblages and leaving the terminals 64 on the package substrates exposed on the opposite side (FIG. 5). In the next phase of the process, the carrier sheets 30 are removed as, for example, by exposing the carrier sheets to an etchant which is effective to remove the carrier sheet but which leaves the terminals 38 and traces 36 substantially intact. After etching, the assemblages have the configuration illustrated in FIG. 6. The assemblages are then severed along lines of separation 88 to yield individual microelectronic packages 90.

Each package 90 (FIGS. 7-9) includes a package substrate 56 with an upper surface 58 and a lower surface 60 extending in horizontal directions and edges 92 extending between the upper and lower surfaces. The package 90 also has electrically conductive elements including the traces 62 and terminals 64 exposed at the lower surface 60. In the completed package, terminals 64 are referred to as "bottom terminals." As used herein with reference to a conductive element such as a terminal or trace, the term "exposed at" a surface means that the conductive element is accessible from that surface. In the particular embodiment illustrated, bottom terminals 64 are disposed on the lower surface 60 so that the bottom terminals project slightly from the lower surface. However, the bottom terminals can be exposed at the lower surface, even if the bottom terminals are embedded in the package substrate 56 or disposed on the top surface 58 of the substrate, provided that there are openings in the substrate which allow access.

The package 90 also includes a first microelectronic element 48 in the form of a chip, such microelectronic element being disposed over the upper surface 58 of the package substrate and electrically connected to the conductive elements, particular traces 62 and bottom terminals 64 on the package substrate.

The package further includes a dielectric mass in the form of the overmold 86 formed during the molding process discussed above, such dielectric mass covering the microelectronic element 48 and at least part of the upper surface of the package substrate. The dielectric mass or overmold 86 defines a top surface 94 remote from the package substrate 56. At least a part of the top surface 94 extends over the microelectronic element 48. Mass or overmold 86 also defines a first edge surface 96 extending downwardly from a top surface 98 adjacent top surface 94 to a bottom border 100 adjacent the package substrate 56 and disposed inside the edges 92 of the package substrate. That is, bottom border 100 is disposed within the horizontal area bounded by the edges 92 of the package substrate. The first edge surface 96 of the dielectric mass slopes away from the microelectronic element 48 in a first horizontal direction $H_1$ (FIGS. 7, 9 and 10A), so that the bottom border 100 of the first edge surface is further from the microelectronic element than the top border 98 in the horizontal direction $H_1$. The first edge surface 96 is shaped such that any straight line extending along the first edge surface at a constant vertical distance from package substrate 56 is disposed at a constant location in the first horizontal direction $H_1$. For example, an imaginary line 102 (FIG. 7) extending at a constant vertical distance from the package substrate would also lie at a constant horizontal location. In the particular embodiment shown, the first edge surface is substantially planar.

Figure 10A:
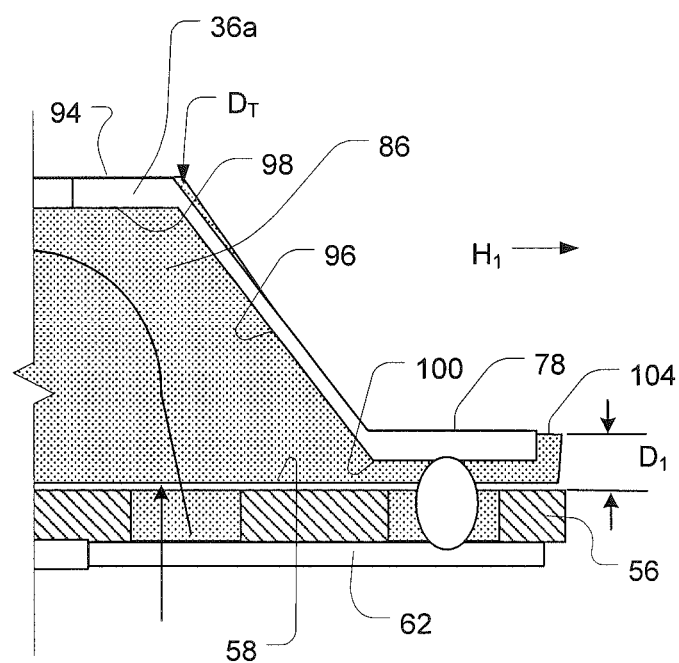
FIG. 10A is a fragmentary sectional view on an enlarged scale showing a portion of the package of FIG. 9.
Figure 10B:
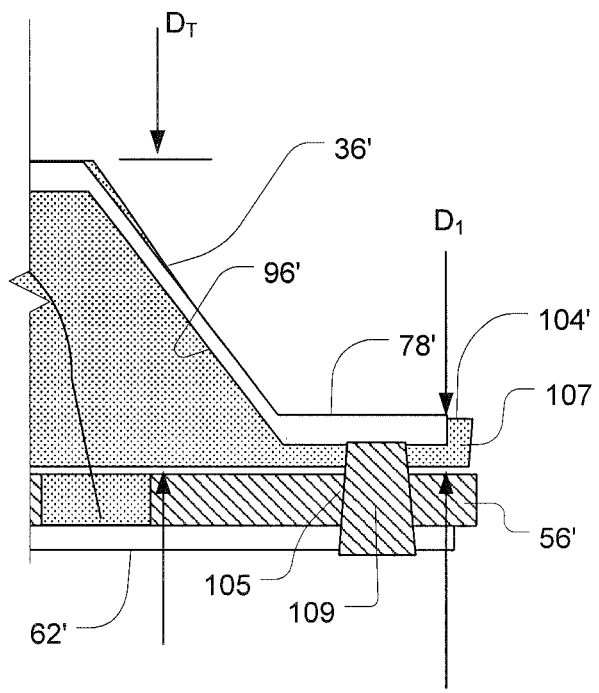
FIG. 10B is a fragmentary sectional view depicting a portion of a package in accordance with a further embodiment of the invention.

As best seen in FIG. 10A, the dielectric mass or overmold further defines a first flange surface 104 facing upwardly, away from the package substrate 56. The first flange surface extends in the first horizontal direction $H_1$, away from bottom border 100 of first edge surface 96. The first flange surface 104 is disposed adjacent package substrate 56. The distance $D_1$ between the first flange surface 104 and the top surface 58 of the package substrate is considerably less than the distance D between the top surface 94 of the dielectric mass and the top surface 58 of the package substrate.

Figure 7:
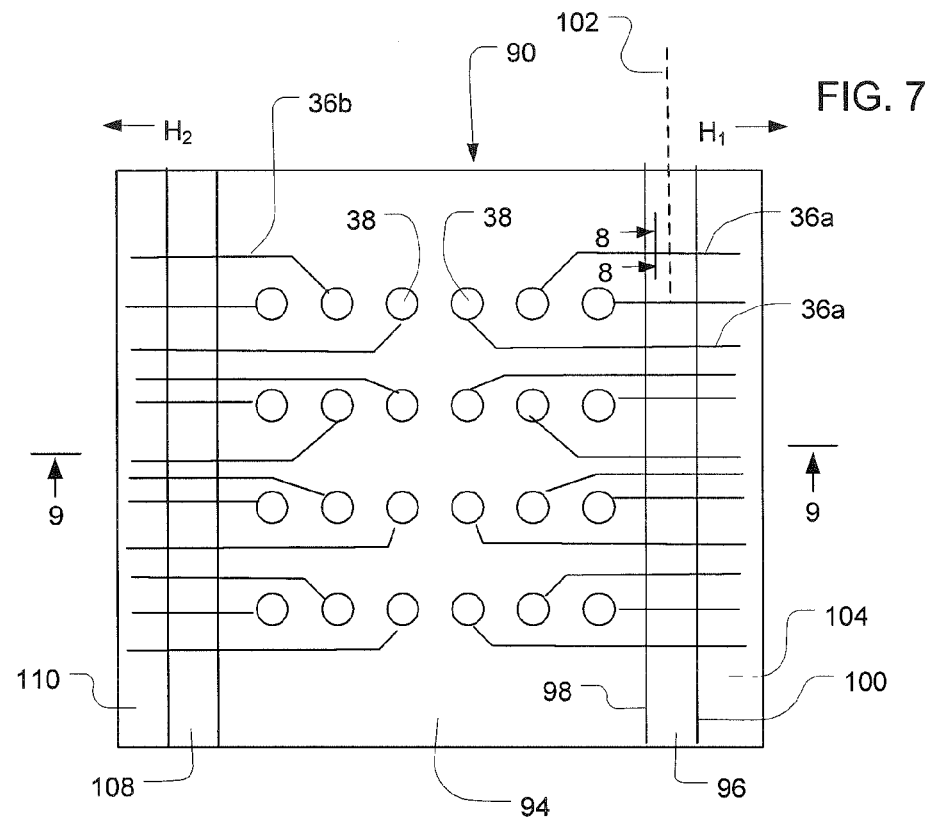
FIG. 7 is a diagrammatic top plan view depicting the package made using the manufacturing process of FIGS. 3-6.
Figure 8:
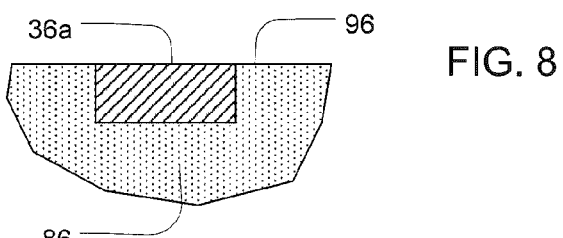
FIG. 8 is a fragmentary sectional view on an enlarged scale taking along line 8-8 in FIG. 7.
Figure 9:
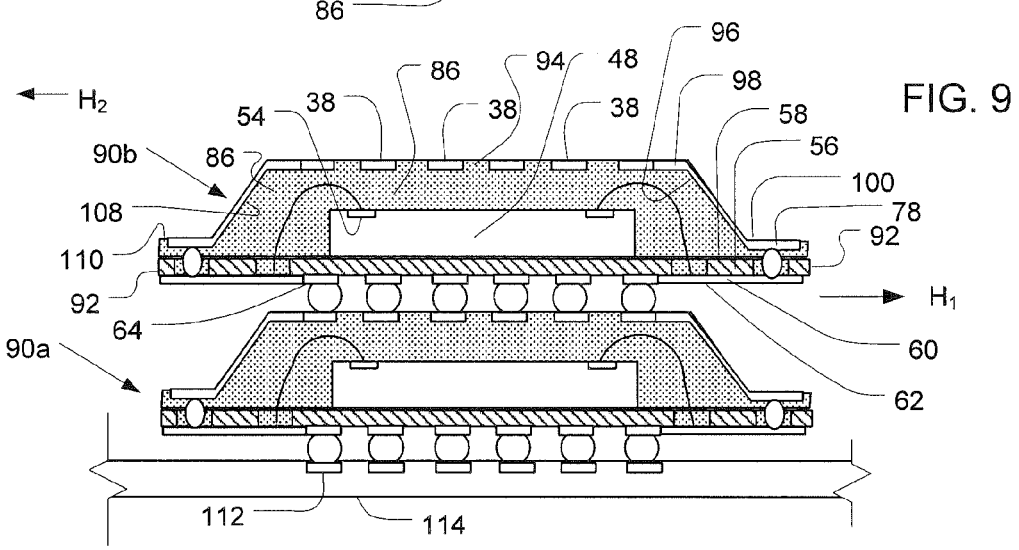
FIG. 9 is a diagrammatic sectional view of the package depicted in FIG. 7 in conjunction with another package.

As shown in FIGS. 7, 9, and 10A, terminals 38 are exposed at the top surface 94 of the dielectric mass. In the completed package, terminals 94 are referred to as "top terminals." A plurality of traces 36a extend along top surface 94 from some of the top terminals 38, and further extend across top border 96 and along the first edge surface 96. Those portions of the traces extending along the first edge surface 96 are substantially parallel to one another. The traces include bottom portions 78, which extend along the first flange surface 104. As used in this disclosure, a statement that a trace extends "along" a surface means that the trace extends in proximity to the surface and substantially parallel to the surface. In the particular embodiment depicted in FIGS. 7, 9, and 10A, the traces are embedded in top surface 94, first edge surface 96, and flange surface 104, with the surfaces of the traces lying substantially flush with the surfaces of the dielectric mass or overmold 86. For example, as seen in FIG. 8, the surface of trace 36a is flush with first edge surface 96. This particular flush disposition results from the fact that the top surface 94, first edge surface 96, and flange surface 104 are formed by the carrier sheet, and the traces were carried on the surface of the carrier sheet at the time of formation. Similarly, top terminals 38 are embedded in the top surface 94 of the dielectric mass. The embedded traces and terminals may be formed from a solid metal as, for example, a solid copper or copper alloy. Typically, a solid metal provides higher conductivity than a composite including metal and a binder. The bottom portions 78 of the traces 36a reside on the flange surface 104 because the bottom portions originally resided on the flange portion 74 of the sheet (FIG. 3). The bottom portions 78 of the traces, of course, remain connected to the conductive elements of the package substrate, and particularly to traces 62, so that the traces 36a, and hence some of top terminals 38 are connected to some of the bottom terminals 64 and to microelectronic element 48.

The package further includes a second edge surface 108 extending downwardly from top surface 94 and sloping away from microelectronic element 48 in a second horizontal direction $H_2$, opposite from the first horizontal direction $H_1$, and a second flange surface 110 extending from the bottom border of second edge surface 108 in the second horizontal direction. The package further includes traces 36b extending from some of top terminals 38 along top surface 94, second edge surface 108, and second flange surface 110. These features are identical to the features of the first edge surface 108, first flange surface 104, and traces 36a discussed above, except that the directions are reversed. Traces 36b connect some of the top terminals 38 to some of the bottom terminals 64 and to microelectronic element 48 through some of the traces 62 on the package substrate.

In this arrangement, some or all of the top terminals 38 are connected to the contacts 54 of the microelectronic element or chip 48 by way of the conductive elements on the package substrate, and some or all of the top terminals 38 are also connected to some or all of the bottom terminals 64. The top terminals 38 are arranged in a pattern corresponding to those of the bottom terminals 64. Thus, as shown in FIG. 9, two or more of the packages 90 can be superposed in a stack, with the top terminals of the bottom package 90a in the stack connected to the bottom terminals 64 of the next higher package 90b. The bottom terminals 64 of the lower-most or bottom package of the stack can be connected to conductive elements such as contact pads 112 on a larger circuit substrate 114, so that the entire stack is mounted and connected to the circuit panel.

A solder mask (not shown) can be applied over the traces 36 extending on the overmold or dielectric mass. Similarly, a solder mask can be provided as needed on the conductive features of the package substrate. Such solder mask can be applied and patterned in any conventional manner. The solder mask serves to limit the spread of solder along the surfaces of the traces.

Of course, the arrangements discussed above with reference to FIGS. 1-10A can be varied in many ways. For example, the conductive features such as the traces 62 are depicted as lying on the bottom surface of the package substrate 56. However, the traces can be disposed on the top surface of the package substrate, or even within the package substrate. Moreover, the package substrate can include more than one layer of traces.

In a further variant, (FIG. 10B) the process discussed above is modified in that the traces on the carrier sheet are not connected to the conductive features of the package substrate prior to introduction of the dielectric composition to form the dielectric mass. Numerous traces 36a extend along the first edge surface 96' of the dielectric mass. Traces 36' are formed with bottom portions 78' extending along the flange surface 104' of the dielectric mass, but are not connected to the conductive features such as traces 62' on the package substrate 56' before the molding operation. Either before or after removal of the carrier or sheet (not shown), vias 105 are formed through the flange portion 107 of the dielectric mass, i.e., the portion disposed beneath the flange surface 104'. Conductors 109 are disposed within these vias and connect the bottom portions 78' of the traces to the conductive elements of the dielectric substrate 56'. In the particular embodiment depicted in FIG. 10B, the vias are formed from the bottom surface of the substrate and hence extend through the substrate, as well as through the flange portion 107 of the dielectric mass or overmold, so that the vias reach from the traces 62' on the bottom surface of the package substrate to the bottom portions 78' of the traces 36' on the dielectric mass.

Positioning of the bottom portions 78' of the traces close to the package substrate greatly facilitates formation of vias 109. Stated another way, distance $D_1$ between the flange surface 104' is considerably smaller than the distance $D_T$ between the package substrate and the top surface. Therefore, the distance which must be penetrated by the vias is much smaller than would be the case if the dielectric mass had a flat top surface extending over the entire package substrate, so that the entire dielectric mass had thickness equal to $D_T$. This facilitates formation of relatively small-diameter vias as are necessary to accommodate relatively closely spaced traces.

In other embodiments, the vias 105 need not penetrate through the package substrate. For example, where the conductive elements include traces on the top surface of the package substrate 56', the vias may be formed from the flange surface and penetrate through only the flange portion 107 of the dielectric mass or overmold.

A process according to a further embodiment of the invention (FIGS. 11 and 12) is similar to the process discussed above, except that the traces 236 and top terminals 238 are carried on a dielectric sheet 230. The dielectric sheet is deformed and positioned over the assemblage of the package substrate 256 and microelectronic element 248 in a manner similar to that discussed above. Thus, a first portion 240 of the carrier and corresponding first portions of traces 236 extend over the microelectronic element, whereas a second portion 242 of the carrier sheet and those portions of the traces 236 lying on the second portion 242 extend from the first portion 240 toward the package substrate 256. Again, a flowable composition is introduced between the sheet and the package substrate and around the microelectronic element and cured, so as to form a dielectric mass or overmold 286 covering the microelectronic element and having a shape defined at least partially by sheet 230. Here again, the mass or overmold includes flange surfaces 204 and flange portions underlying the flange surfaces. Portions 278 of traces 236 overlie the flange portions, and thus are disposed adjacent to the package substrate and at a distance closer to the package substrate than the top terminals 238 and the adjacent portions of the traces. In this embodiment, the bottom portions 278 of the traces are not connected to the conductive features of the package substrate prior to introduction of the dielectric composition. Instead, vias are formed through the flange portions of the mass and through the corresponding portions of sheet 230, and via conductors 209 are formed within these vias to connect the bottom portions 278 of the traces to the conductive elements of the package substrate, such as traces 262.

In this embodiment as well, the processes of handling the sheet and molding the dielectric masses may be performed while the sheets and package substrates remain in the form of a continuous or semi-continuous sheet or tape incorporating elements which form numerous individual packages. The packages can be severed from one another before or after forming the vias and via conductors 209.

The completed package, as depicted in FIG. 12, incorporates portions of sheet 230 as part of the package structure. Desirably, the sheet 230 adheres to the dielectric mass 286. For this purpose, the sheet 230 may incorporate an adhesive at surface 231, which faces toward the package substrate during the molding process. Thus, the dielectric sheet 230 forms a layer closely overlying the dielectric mass 286 and adhering thereto in the final product. In other embodiments, the flowable dielectric material itself may serve as an adhesive which bonds the formed dielectric mass to the sheet. Merely by way of example, the sheet may include materials commonly used in flexible printed circuits as, for example, polyimides and BT resin. Also, a solder mask (not shown) may be applied over the traces on the sheet prior to deforming the sheet, provided that the solder mask can withstand the temperatures and pressures used during the molding process.

A process according to a further embodiment of the invention (FIG. 13) uses a pair of mold elements 382 and 384 to form the dielectric mass 386. In this process, the carrier and traces are not present at the time of molding. The dielectric mass has a configuration similar to those discussed above and again includes flange portions 307 defining flange surfaces 304, as well as a top surface 394 and one or more edge surfaces 396. Here again, the edge surfaces extend from top borders at top surface 394 to bottom borders 398 disposed within the area of the package substrate 356. As discussed above, the edges 394 of the package substrate may be defined after the molding step, when the package substrate 356 is severed from a larger sheet or tape.

After the molding process, a sheet 330 carrying the traces 336 and top terminals 338 is applied over the top surface 394 of the dielectric mass and over the edge surfaces 396 and flange surfaces 304. Here again, bottom portions of the traces are disposed adjacent the package substrate 356, so that vias may be readily formed through the relatively thin flange portions 307 of the dielectric mass or overmold. Via conductors 309 are disposed in the vias and electrically connect the traces 336 on the sheet to the conductive elements 362 of the package substrate. In the particular embodiment depicted in FIG. 14, the sheet 330 is bonded to the dielectric mass by a thin layer of an adhesive 301. Also, the sheet carries a solder mask layer 303.

A process according to a further embodiment uses an assemblage 446 similar to those discussed above, except that the microelectronic element or chip 448 is positioned in a "face-down" orientation relative to the package substrate 456. The package substrate incorporates conductive elements including traces 463 on the upper surface of the package substrate, additional traces 462 on the lower surface of the package substrate, bottom terminals 464 and through conductors 465 connecting upper surface traces 463 with the lower surface traces and bottom terminals. The contacts 454 of the microelectronic element or chip 448 are bonded to the upper surface conductive elements 463 as, for example, by solder bonds. The dielectric mass or overmold 486 is formed using mold elements similar to the mold elements discussed above with reference to FIG. 13 and has a similar configuration. Vias 405 are formed through the flange portion of the dielectric mass, from the upwardly facing flange surface 404 to the upper surface conductive elements 463. Vias 405 may be formed during the molding process as, for example, by bumps or protrusions on the mold which engage the upper surface conductive elements. Alternatively, vias 405 may be formed by processes such as laser ablation, etching, sand-blasting or the like after molding. In a further alternative, vias 463 may be formed in part by features of the mold and in part by post-mold processing. After formation of the dielectric mass or overmold 486 and vias 405, a dielectric sheet 430 carrying traces 436 and top terminals 438 is mounted on the dielectric mass using an adhesive layer (not shown). In this embodiment, sheet 430 carries the traces 436 on the surface of the sheet facing toward the dielectric mass. Thus, terminals 438 are exposed at the top surface 494 of the mass through openings 439 in the sheet. These openings can be formed before or after the sheet 430 is assembled to the overmold. The bottom portions 478 of traces 436 are bonded to the upper surface conductive elements 463 of the package substrate 456 by bonds 409 disposed within vias 405. Merely by way of example, such bonds may be formed by soldering, eutectic bonding thermosonic bonding or the like. The bonding materials may be carried on the traces 436 or may be deposited into the vias. Here again, the proximity of the trace bottom portions 478 to the package substrate facilitates the bonding process and the use of small bonds, which, in turn, permit close spacing of the trace bottom portions. Numerous traces can be accommodated on the structure. A package substrate and microelectronic element of the type shown in FIGS. 15 and 16 can be utilized in the processes and structures discussed above. Also, the dielectric sheet 430 with traces on the side facing toward the package substrate can be used in a process similar to that of FIGS. 11 and 12, where the sheet is placed into the mold and the dielectric mass is shaped by contact with the sheet. In this case, openings 439 desirably are formed after the molding process.

Figure 17:
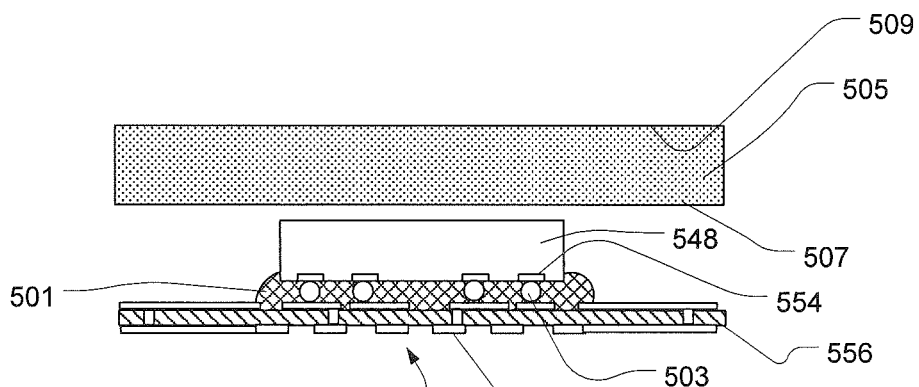
FIG. 17 is a diagrammatic sectional view depicting a stage in manufacturing process according to yet another embodiment of the invention.
Figure 18:
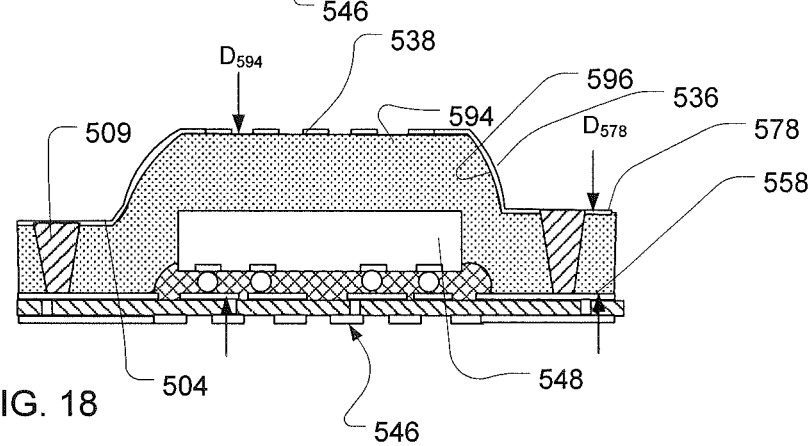
FIG. 18 is a sectional view depicting the package made in the process of FIG. 17.

A process according to a further embodiment of the invention (FIGS. 17 and 18) forms a dielectric mass on an assemblage 546, which, like the assemblage discussed above with reference to FIGS. 15 and 16, has a microelectronic element in face-down orientation with the contacts 554 facing toward the package substrate 556, so that the contacts are joined to conductive elements on the package substrate. Here again, the assemblage includes bottom terminals 564 carried on the lower surface of the package substrate 556. The particular assemblage depicted in FIG. 17 includes an underfill 501 disposed within the space between the microelectronic element or chip 548 and the package substrate upper surface. The underfill desirably surrounds the connections 503 between the microelectronic element and the conductive elements of the package substrate.

A conformal dielectric layer 505 having a first surface 507 and a second surface 509 is used in the process. When the conformal layer is applied to the assemblage 546, the conformal layer sags into contact with the upper surface 558 of the package substrate 556, with the exposed surfaces of the microelectronic element 548, and with the underfill 501. Thus, at the time the conformal layer is applied to the assemblage, the conformal layer should have sufficient softness and deformability to conform in this manner. Merely by way of example, the conformal layer may be a "B-stage" or partially cured epoxy composition, which may optionally contain a particulate filler material. After application, the conformal layer may be hardened as, for example, by chemical reaction. As the conformal layer deforms to cover the exposed elements of assemblage 546, a first portion of the conformal layer defines a top surface 594, (FIG. 18) remote from package substrate 556 and extending over microelectronic element 548, whereas additional portions of the conformal layer define edge surfaces 596 extending downwardly toward the package substrate in an area of the package substrate outside of the area covered by microelectronic element 548.

After the conformal layer is applied and cured, traces 536 and top terminals 538 are formed on the cured layer. For example, the entire conformal layer can be plated, masked and selectively etched to form the top terminals and traces. Alternatively, the surface of the conformal layer may be covered with a mask material, and then selectively exposed to laser radiation to cut grooves through the mask. A seed layer can be applied over the mask and into the grooves, whereupon the mask is removed so as to lift off the seed layer everywhere except at the grooves. The surface is then exposed to a plating bath, so that metal is deposited only at the grooves where the seed is present. Any other technique for forming metallic features on a dielectric body can be used. Here again, the top terminals are exposed on the top surface 594 and traces 536 extend from at least some of the top terminals along the top surface 594 and also extend downwardly toward the package surface 556 along edge surfaces 596. In this embodiment as well, bottom portions 578 of the traces are disposed at a distance $D_{578}$ from the package substrate, which is smaller than the distance $D_{594}$ between the package substrate and the top surface 594 and hence smaller than the distance between the package substrate and terminals 538. Here again, the difference in height facilitates connection of the bottom portions to the conductive elements of the package substrate. In the particular embodiment of FIG. 18, the conformal layer forms flange portions 507 defining flange surfaces 504, and the bottom portions 578 of the traces extend along the flange surfaces. The bottom portions are connected to the conductive elements of the substrate by forming vias through the flange portions and depositing via conductors 509 in these vias.

The process of applying a conformal layer, like the other processes discussed above, can be conducted using assemblages which are formed as a large sheet of many assemblages having a common package substrate, using a continuous or semi-continuous conformal layer having traces and terminals for numerous packages. The assemblages are severed from one another after application of the conformal layer.

It should be appreciated that the drawings are not to scale. For example, the vertical dimensions of the microelectronic element 548 and the conformal layer itself are greatly exaggerated for clarity of illustration. In practice, the height or distance $D_{594}$ from the package substrate to the top surface and top terminals may be on the order of a few hundred microns or less, commonly about 400 microns or less, whereas the bottom portions 548 of the traces are disposed at an even smaller height $D_{579}$ above the package substrate. The conformal layer forms the dielectric mass of the package. In this regard, the term "dielectric mass" does not imply any particular minimum thickness or shape.

In a variant of the process discussed above with reference to FIGS. 17 and 18, the conformal layer is applied to the assemblages 546 with traces 536 and top contacts 538 already in place on the conformal layer. For example, the conformal layer itself may include plural sub-layers such as a flexible top layer bearing the top contacts and terminals and a conformal bottom layer such as a B-stage epoxy.

Figure 19:
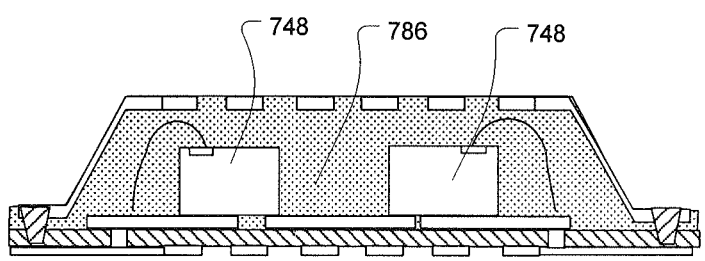
FIG. 19 is diagrammatic sectional view of a package according to yet another embodiment of the invention.

Numerous further variations and combinations of the features discussed above can be utilized. Merely by way of example, the dielectric mass may have one, two, or more than two edge surfaces with traces extending thereon. Also, the package may include more than one microelectronic element. Merely by way of example, the package depicted in FIG. 19 is similar to the package discussed above with reference to FIGS. 1-10A, but incorporates two microelectronic elements 748 in the dielectric mass 786.

A package according to a further embodiment of the invention (FIG. 20) incorporates a microelectronic element 848 and package substrate 856 generally similar to the corresponding elements of the packages discussed above with respect to, e.g., FIGS. 9-10A and 10B. In this embodiment as well, the microelectronic element 848 is electrically connected to conductive elements on package substrate 856 and is covered by a first dielectric mass 886. Here again, this dielectric mass defines a top surface 894 and a first edge surface 896 extending toward the package substrate from top surface 894. The dielectric mass also includes a flange portion 804 projecting outwardly in the first horizontal direction $H_1$ (to the right in FIG. 20).

Figure 20:
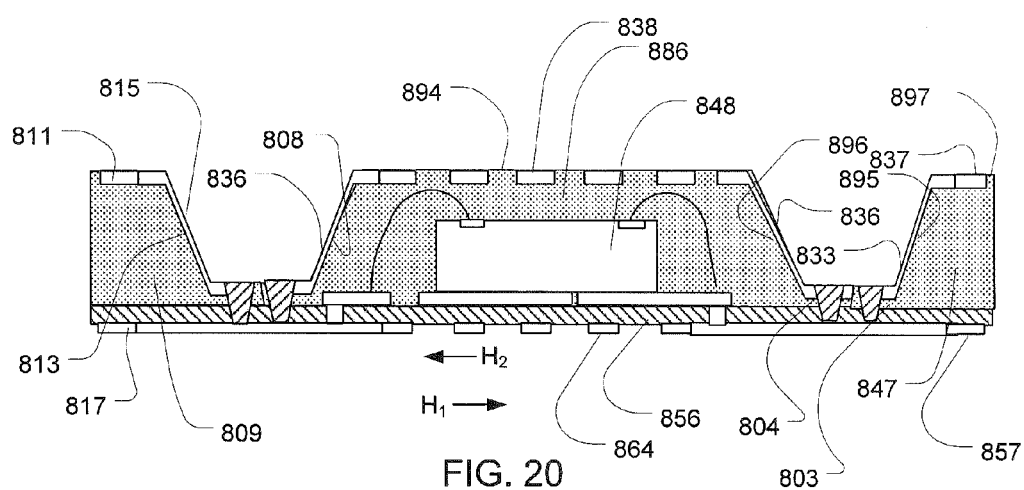
FIG. 20 is a diagrammatic sectional view of a package according to a further embodiment of the invention.

In the embodiment of FIG. 20, however, substrate 856 extends beyond flange portion 804. An auxiliary dielectric mass 847 is disposed on this protruding portion of the package substrate. Auxiliary dielectric mass 847 defines a top surface 897 coplanar with the top surface 894 of the first dielectric mass 886. The auxiliary dielectric mass also defines an edge surface 895 extending downwardly from the top surface 897 toward the package substrate. Edge surface 895 slopes in the second horizontal direction $H_2$, opposite to the first horizontal direction, so that the first edge surface 896 of the first dielectric mass 886 and the edge surface 895 of auxiliary dielectric mass 897 converge with one another in the downward direction, toward package substrate 856. These edge surfaces cooperatively define a trench extending downwardly from top surfaces 894 and 897. The trench and edge surfaces are elongated structures extending into and out of the plane of the drawing as seen in FIG. 20. The auxiliary dielectric mass 897 defines a flange region 803 projecting inwardly toward microelectronic element 848 from the bottom border of edge surface 895. Flange region 803 merges with the flange region 804 of the first dielectric mass 886. It should be appreciated that although these dielectric masses and portions are described separately, they are, in fact, portions of a unitary dielectric body.

As in the embodiments discussed above, top terminals 838 are exposed at the top surface 894 of the first dielectric mass 886. Traces 836, connected to at least some of the top terminals, extend along the first edge surface 896 of mass 886 and have bottom portions connected to conductive elements of the package substrate. In the embodiment of FIG. 20, however, auxiliary top terminals 837 are exposed at the top surface 897 of the auxiliary dielectric mass 847. Traces 833 extend from at least some of these auxiliary top terminals along the top surface 897 of the auxiliary mass and along the sloping edge surface 895 of the auxiliary mass 847. Bottom portions of traces 833, disposed adjacent the package substrate 856, are also connected to the conductive elements of the package substrate. As in the embodiments discussed above, the package substrate defines an array of bottom terminals in alignment with the first dielectric mass 886 and in alignment with the top terminals 838 carried by the first dielectric mass. In the embodiment of FIG. 20, the package substrate also defines auxiliary bottom terminals 857 in alignment with the auxiliary top terminals 837, carried on the auxiliary mass 847.

In this embodiment, the first dielectric mass 886 also has a second edge surface 808 sloping in the second horizontal direction $H_2$, and some of the traces 836 extend from some of the top terminals 838 along the second edge surface 808. The dielectric body includes a second auxiliary mass 809 having auxiliary top terminals 811 exposed at the top surface of this mass, and having an edge surface 813 extending downwardly from the top surface of the mass and sloping in the first horizontal direction $H_1$, so that edge surface 813 converges with the second edge surface 808 of the first dielectric mass 886. These edge surfaces cooperatively define a further elongated trench extending into and out of the plane of the drawing as seen in FIG. 20. Additional auxiliary traces 815 extend along the edge surface of the additional auxiliary mass 809. These traces are connected to the conductive elements of the package substrate 856. The package substrate defines additional auxiliary bottom terminals 817 in alignment with the additional auxiliary top terminals 811. Auxiliary mass 809 defines a flange region which merges with the flange region at the bottom of second edge surface 808 of the first dielectric mass 886. Here again, the additional auxiliary mass 808 and the first dielectric mass 886 form parts of a unitary dielectric body.

Each of the auxiliary dielectric masses may carry one row or more than one row of top contacts 811, 837. These top contacts and the auxiliary bottom contacts 857, 817, aligned with these top contacts, provide additional connectivity and additional routing of signals in a stack of packages. The packages as shown in FIG. 20 can be stacked one atop the other, with the auxiliary top contacts aligned with the auxiliary bottom contacts of the next higher package in the stack. The top contacts 838 of the first dielectric mass are aligned with the bottom contacts 864 of the next higher package in the stack.

Packages as depicted in FIG. 20 may be fabricated by methods essentially the same as those discussed above and may incorporate the features discussed above. Merely by way of example, the sheet or carrier used to form the package is not present in the finished package depicted in FIG. 21. However, a package with auxiliary dielectric masses can incorporate features such as a dielectric sheet as discussed with reference to FIGS. 11, 12, and 16. In yet another variant, one or more microelectronic elements can be disposed within one or more of the auxiliary masses.

Figure 21:
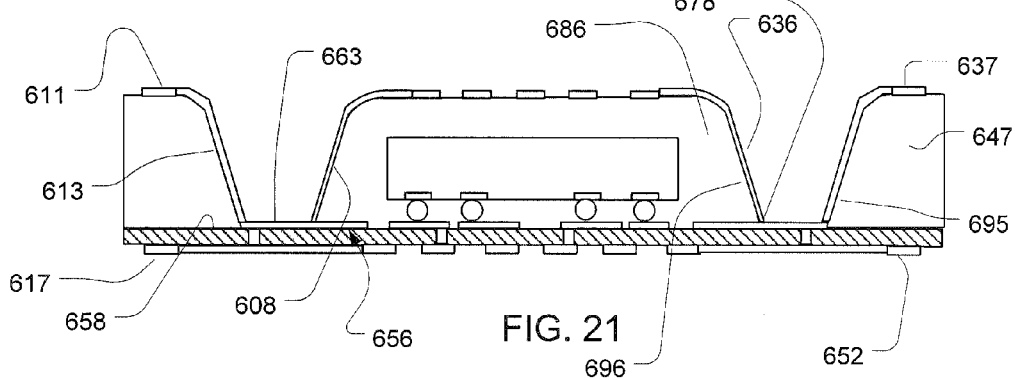
FIG. 21 is a diagrammatic sectional view depicting a package according to yet another embodiment of the invention.

A package according to a further embodiment of the present invention (FIG. 21) is similar to the package of FIG. 20 in that the package of FIG. 21 includes a first or main dielectric mass 686 having a first edge surface 696 and a second edge surface 608. The package further includes a first auxiliary dielectric mass 647 having a sloping edge surface 695 converging with the first edge surface 696 of mass 686, and a second auxiliary dielectric mass having a sloping edge surface 613 converging with the second edge surface 608 of mass 686. Here again, auxiliary top contacts 637 and 611 are provided on the auxiliary dielectric masses, and auxiliary bottom contacts 617 and 657 are provided on the bottom surface of the package substrate for increased connectivity. However, the dielectric masses in the package of FIG. 21 do not include flange surfaces. Thus, edge surfaces 696, 608, 695, and 613 extend all the way to the upper surface 658 of the package substrate 656. The traces extend downwardly along the edge surfaces so that the bottom portion of each trace terminates at the bottom of the edge surface, where the traces join the conductive elements 663 on the upper surface of the package substrate.

In yet another variation, a carrier used to hold the traces and top terminals may be an element other than a sheet. For example, the traces and terminals can be deposited onto a mold element which is then used to form the top surface and edge surfaces of a dielectric mass. When the mold is removed, the top terminals and traces remain embedded in the dielectric mass, in much the same way as discussed with reference to FIGS. 1-10A above.

Figure 22:
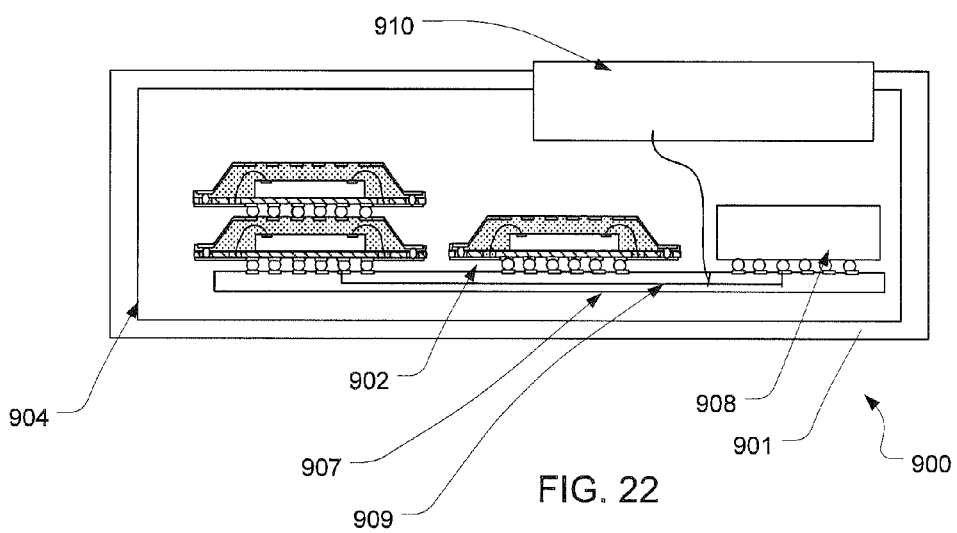
FIG. 22 is a diagrammatic view depicting a system according to one embodiment of the invention.

The packages discussed above can be utilized in construction of diverse electronic systems. For example, a system 900 (FIG. 22) in accordance with a further embodiment of the invention includes a first package 902 as described above in conjunction with a stack 904 incorporating two packages as described above, and in conjunction with other electronic components 908 and 910. In the example depicted, component 908 is a semiconductor chip whereas component 910 is a display screen, but any other components can be used. Of course, although only two additional components are depicted in FIG. 22 for clarity of illustration, the system may include any number of such components. Packages 902 and 904 and components 908 and 910 are mounted to a common housing 901, schematically depicted in broken lines, and are electrically interconnected with one another as necessary to form the desired circuit. In the exemplary system shown, the system includes a circuit panel 907 such as a flexible or rigid printed circuit board, and the circuit panel includes numerous conductors 909, of which only one is depicted in FIG. 22, interconnecting the components with one another. An off-board connector 911 connects component 910 to the circuit panel. However, this is merely exemplary; any suitable structure for making electrical connections can be used. The housing 901 is depicted as a portable housing of the type usable, for example, in a cellular telephone or personal digital assistant, and screen 910 is exposed at the surface of the housing. Again, the simplified system shown in FIG. 22 is merely exemplary; other systems, including systems commonly regarded as fixed structures, such as desktop computers, routers and the like can be made using the packages discussed above.

As these and other variations and combinations of the features discussed above can be utilized without departing from the present invention, the foregoing description of the preferred embodiments should be taken by way of illustration rather than by way of limitation of the invention as defined by the claims.

The invention claimed is:

1. A structure comprising:
a substrate having upper and lower surfaces extending in horizontal directions and edges extending between the upper and lower surfaces;
electrically conductive elements on the substrate, the conductive elements including bottom terminals exposed at the lower surface of the substrate;
a dielectric mass covering at least part of the upper surface of the substrate, the dielectric mass defining a top surface remote from the substrate facing away from the substrate, the dielectric mass defining a first edge surface extending downwardly from a top border adjacent the top surface of the dielectric mass to a bottom border adjacent the substrate and inside the edges of the substrate, the dielectric mass further defining an upwardly-facing flange surface extending away from the bottom border of the first edge surface in a horizontal direction adjacent the substrate, the flange surface being disposed at a vertical distance from the substrate less than a vertical distance between the substrate and the top surface;
a plurality of top terminals exposed at the top surface of the dielectric mass; and
a plurality of traces extending from the top terminals along the top surface and extending along the first edge surface, the traces having bottom portions extending along the flange surface, the bottom portions being electrically connected to the conductive elements of the substrate.

2. A structure as claimed in claim 1, wherein the first edge surface slopes in a first horizontal direction.

3. A structure as claimed in claim 2, wherein the first edge surface of the dielectric mass is shaped such that a straight line extending along the first edge surface at a constant vertical distance from the substrate has a constant location in the first horizontal direction.

4. A structure as claimed in claim 2, wherein the first edge surface of the dielectric mass is generally planar.

5. A structure as claimed in claim 2, wherein the dielectric mass defines a second edge surface extending downwardly from a top border adjacent the top surface of the dielectric mass to a bottom border adjacent the substrate, the second edge surface sloping in a second horizontal direction, the package further comprising second traces extending along the top surface of the dielectric mass and extending downwardly along the second edge surface to bottom portions adjacent the substrate.

6. A structure as claimed in claim 5, wherein the second horizontal direction is opposite to the first horizontal direction.

7. A structure as claimed in claim 1, wherein the plurality of traces extend substantially parallel to one another along the first edge surface.

8. A structure as claimed in claim 1, wherein the traces are at least partially embedded in the first edge surface and the top surface of the dielectric mass.

9. A structure as claimed in claim 1, wherein the top terminals are integral with the traces and at least partially embedded in the top surface of the dielectric mass.

10. A structure as claimed in claim 1, wherein the traces extend over the first edge surface and the top surface.

11. A structure as claimed in claim 10 further comprising an adhesive layer between the traces and the first edge surface and top surface.

12. A structure as claimed in claim 1 further comprising electrically conductive via connectors extending through the flange surface of the dielectric mass and electrically connecting the bottom portions of the traces with the conductive elements of the substrate.

13. A structure as claimed in claim 1, wherein the dielectric mass is an overmold.

14. A structure as claimed in claim 1, wherein the dielectric mass is a conformal layer.

15. A structure as claimed in claim 1, wherein the top terminals are disposed in an area array.

16. A structure as claimed in claim 15, wherein the bottom terminals include central terminals aligned with at least some of the top terminals.

17. A structure as claimed in claim 1 further comprising an auxiliary dielectric mass covering a portion of the substrate, the auxiliary dielectric mass defining an auxiliary top surface remote from the substrate, the structure further comprising auxiliary top terminals exposed at the auxiliary top surface, at least some of the auxiliary top terminals being electrically connected to the conductive elements of the substrate.

18. A structure as claimed in claim 17, wherein the auxiliary dielectric mass defines an auxiliary edge surface extending from the auxiliary top surface toward the substrate, the auxiliary edge surface and the first edge surface cooperatively defining an elongated trench, the package further comprising auxiliary traces extending along the auxiliary edge surface, the auxiliary top terminals being connected to the conductive elements of the substrate through the auxiliary traces.

19. A structure as claimed in claim 1, wherein the traces are at least partially uncovered and at least partially covered by dielectric material.

20. A structure comprising:
a substrate having upper and lower surfaces extending in horizontal directions;
an overmold covering at least part of the upper surface of the substrate, the overmold defining a top surface remote from the substrate facing away from the substrate; and
solid metallic top terminals exposed at the top surface of the overmold; and
a plurality of solid metallic traces extending from the top terminals along the top surface of the overmold, the top terminals and traces being at least partially embedded in the overmold.

21. A structure as claimed in claim 20, wherein the substrate has electrically conductive elements thereon, at least some of the top terminals being electrically connected to at least some of the electrically conductive elements.

22. A structure as claimed in claim 21, wherein the electrically conductive elements of the substrate include bottom terminals exposed at the lower surface of the substrate.

23. A structure as claimed in claim 20, wherein the traces are at least partially uncovered and at least partially covered by dielectric material.

24. A microelectronic package comprising:
a microelectronic element;
a package substrate having upper and lower surfaces extending in horizontal directions, the microelectronic element being disposed over the upper surface of the package substrate;
an overmold covering the microelectronic element and at least part of the upper surface of the microelectronic element, the overmold defining a top surface remote from the package substrate facing away from the package substrate, at least a part of the overmold top surface extending over the microelectronic element;
solid metallic top terminals exposed at the top surface of the overmold; and
a plurality of solid metallic traces extending from the top terminals along the top surface of the overmold, the top terminals and traces being at least partially embedded in the overmold.

25. A package as claimed in claim 24, wherein at least one of the top terminals is configured to connect to a conductive element of an external component.

26. A package as claimed in claim 24, wherein at least one of the top terminals is configured to be solderable to a conductive element of an external component.

27. A package as claimed in claim 24, wherein the package substrate has electrically conductive elements thereon, at least some of the top terminals being electrically connected to at least some of the electrically conductive elements.

28. A package as claimed in claim 27, wherein the electrically conductive elements of the package substrate include bottom terminals exposed at the lower surface of the package substrate.

29. A package as claimed in claim 24, wherein at least some of the top terminals overlie the microelectronic element.

30. A package as claimed in claim 24, wherein the traces are at least partially uncovered and at least partially covered by dielectric material.

* * * * *